(12) United States Patent
Chen et al.

(10) Patent No.: US 12,721,194 B2
(45) Date of Patent: Aug. 25, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Ming-Fa Chen, Taichung City (TW); Yun-Han Lee, Baoshan Township (TW); Lee-Chung Lu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 621 days.

(21) Appl. No.: 18/151,801

(22) Filed: Jan. 9, 2023

(65) Prior Publication Data

US 2024/0128194 A1 Apr. 18, 2024

Related U.S. Application Data

(60) Provisional application No. 63/416,257, filed on Oct. 14, 2022.

(51) Int. Cl.
*H10W 70/65* (2026.01)
*H10D 84/01* (2026.01)
(Continued)

(52) U.S. Cl.
CPC ............ *H10W 70/65* (2026.01); *H10D 84/01* (2025.01); *H10W 70/093* (2026.01); (Continued)

(58) Field of Classification Search
CPC ..... H01L 2224/94; H01L 2224/80894–80896; H01L 2224/81894; H01L 2224/81895; (Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 201813032 A 4/2018
TW 202029418 A 8/2020
(Continued)

*Primary Examiner* — Zandra V Smith
*Assistant Examiner* — Douglas Yap
(74) *Attorney, Agent, or Firm* — Slater Matsil, LLP

(57) ABSTRACT

Integrated circuit packages and methods of forming the same are provided. In an embodiment, a device includes: a power distribution interposer including: a first bonding layer; a first die connector in the first bonding layer; and a back-side interconnect structure including a power rail connected to the first die connector; and an integrated circuit die including: a second bonding layer directly bonded to the first bonding layer by dielectric-to-dielectric bonds; a second die connector in the second bonding layer, the second die connector directly bonded to the first die connector by metal-to-metal bonds; and a device layer on the second bonding layer, the device layer including a contact and a transistor, the transistor including a first source/drain region, the contact connecting a back-side of the first source/drain region to the second die connector.

17 Claims, 17 Drawing Sheets

(51) Int. Cl.

| | |
|---|---|
| ***H10W 70/05*** | (2026.01) |
| ***H10W 70/60*** | (2026.01) |
| ***H10W 72/00*** | (2026.01) |
| ***H10W 74/00*** | (2026.01) |
| ***H10W 80/00*** | (2026.01) |
| ***H10W 90/00*** | (2026.01) |

(52) U.S. Cl.

CPC .......... *H10W 70/611* (2026.01); *H10W 90/00* (2026.01); *H10W 90/401* (2026.01); *H10W 90/701* (2026.01); *H10W 72/0198* (2026.01); *H10W 74/00* (2026.01); *H10W 80/312* (2026.01); *H10W 80/327* (2026.01); *H10W 80/334* (2026.01); *H10W 90/794* (2026.01)

(58) Field of Classification Search

CPC ................................. H01L 2224/81896; H01L 2224/83894–83896; H01L 2224/86895–86897; H01L 2224/82895–82897; H01L 2224/80201; H01L 2224/80203–80204; H01L 23/5286; H01L 23/481; H01L 23/538–5389; H10W 72/0198; H10W 70/65

See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,043,740 | B2 | 8/2018 | Boyapati et al. | |
| 11,049,834 | B2 | 6/2021 | Wang et al. | |
| 11,164,818 | B2 | 11/2021 | Pietambaram et al. | |
| 11,195,818 | B2 | 12/2021 | Chen et al. | |
| 11,309,291 | B2 | 4/2022 | Chen et al. | |
| 11,694,993 | B2 | 7/2023 | Cheng et al. | |
| 2019/0067157 | A1* | 2/2019 | Lin | H01L 23/433 |
| 2021/0407942 | A1* | 12/2021 | Yu | H01L 24/19 |
| 2022/0310545 | A1* | 9/2022 | Shih | H01L 24/19 |

FOREIGN PATENT DOCUMENTS

| | | | |
|---|---|---|---|
| TW | 202105652 | A | 2/2021 |
| TW | 202118019 | A | 5/2021 |
| TW | I741461 | B | 10/2021 |
| TW | 202213689 | A | 4/2022 |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/416,257, filed on Oct. 14, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
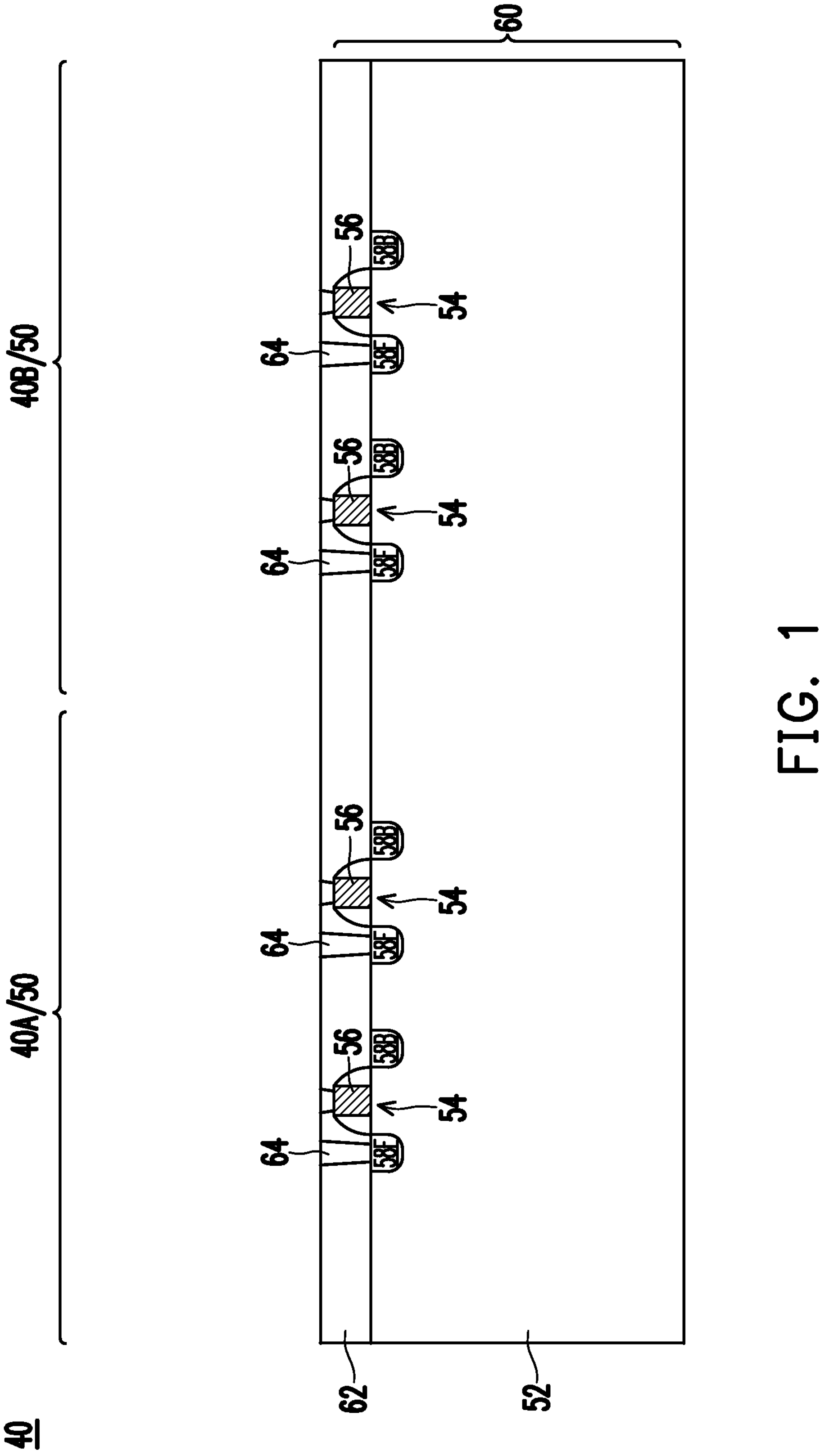
FIGS. 1-6 are cross-sectional views of intermediate steps during a process for forming integrated circuit dies, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an interconnect structure is built up and then multiple integrated circuit dies are attached to the interconnect structure. The interconnect structure is shared by the integrated circuit dies, and includes power distribution networks and die-to-die bridges for the integrated circuit dies. A power distribution network includes conductive lines (e.g., power rails) for providing reference and supply voltages to the devices of an integrated circuit die. More specifically, the power rails for the integrated circuit dies are located in the shared interconnect structure instead of in the integrated circuit dies. The interconnect density of the integrated circuit dies may thus be increased.

FIGS. 1-6 are cross-sectional views of intermediate steps during a process for forming integrated circuit dies 50, in accordance with some embodiments. The integrated circuit dies 50 will be packaged in subsequent processing to form an integrated circuit package. Each of the integrated circuit dies 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit dies 50 are formed in a wafer 40, which includes different device regions that are singulated in subsequent steps to form a plurality of integrated circuit dies. A first device region 40A and a second device region 40B are illustrated, but it should be appreciated that the wafer 40 may have any number of device regions. The integrated circuit dies 50 are processed according to applicable manufacturing processes to form integrated circuits.

In FIG. 1, a semiconductor substrate 52 is provided. The semiconductor substrate 52 may be silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) are formed at the front surface of the semiconductor substrate 52. The devices 54 may be active devices (e.g., transistors, diodes, etc.), capacitors, resistors, etc. The devices 54 may be formed in a front-end of line (FEOL) process by acceptable deposition, photolithography, and etching techniques. For example, the devices 54 may include gate structures 56 and source/drain regions 58, where the gate structures 56 are on channel regions, and the source/drain regions 58 are adjacent the channel regions. Source/drain region(s) 58 may refer to a source or a drain, individually or collectively dependent upon the context. Although the devices 54 are illustrated as planar transistors, they may also be nanostructure field-effect transistors (Nanostructure-FETs), fin field-effect transistors (FinFETs), or the like. The channel regions may be patterned regions of the semiconductor substrate 52. For example, the channel regions may be regions of semiconductor fins, semiconductor nanosheets, semiconductor nanowires, or the like patterned in the semiconductor substrate 52.

As subsequently described in greater detail, an upper interconnect structure (e.g., a front-side interconnect structure) will be formed over the semiconductor substrate 52. Some or all of the semiconductor substrate 52 will then be removed and replaced with a lower interconnect structure (e.g., a back-side interconnect structure). Thus, a device layer 60 of the devices 54 is formed between a front-side interconnect structure and a back-side interconnect structure. The front-side and back-side interconnect structures each include conductive features that are connected to the devices 54 of the device layer 60. The conductive features (e.g., interconnects) of the front-side interconnect structure will be connected to front-sides of the source/drain regions 58F and the gate structures 56 to form integrated circuits, such as logic circuits, memory circuits, image sensor circuits, or the like. The conductive features (e.g., interconnects) of the back-side interconnect structure will be connected to back-sides of the source/drain regions 58B to provide power, ground, and/or input/output connections for the integrated circuits.

An inter-layer dielectric 62 is formed over the active surface of the semiconductor substrate 52. The inter-layer dielectric 62 surrounds and may cover the devices 54, e.g., the gate structures 56 and/or the source/drain regions 58. The inter-layer dielectric 62 may include one or more dielectric layers formed of dielectric materials such as Phospho-Silicate Glass (PSG), Boro-Silicate Glass (BSG), Boron-Doped Phospho-Silicate Glass (BPSG), undoped Silicate Glass (USG), or the like.

Upper contacts 64 are formed through the inter-layer dielectric 62 to electrically and physically couple the devices 54. For example, the upper contacts 64 may include gate contacts and source/drain contacts that are electrically and physically coupled to, respectively, the gate structures 56 and the source/drain regions 58F. Specifically, the upper contacts 64 are in contact with the front-sides of the source/drain regions 58F. The upper contacts 64 may be formed of a suitable conductive material such as tungsten, cobalt, nickel, copper, silver, gold, aluminum, the like, or combinations thereof, which may be formed by a deposition process such as physical vapor deposition (PVD) or chemical vapor deposition (CVD), a plating process such as electrolytic or electroless plating, or the like.

Figure 2:
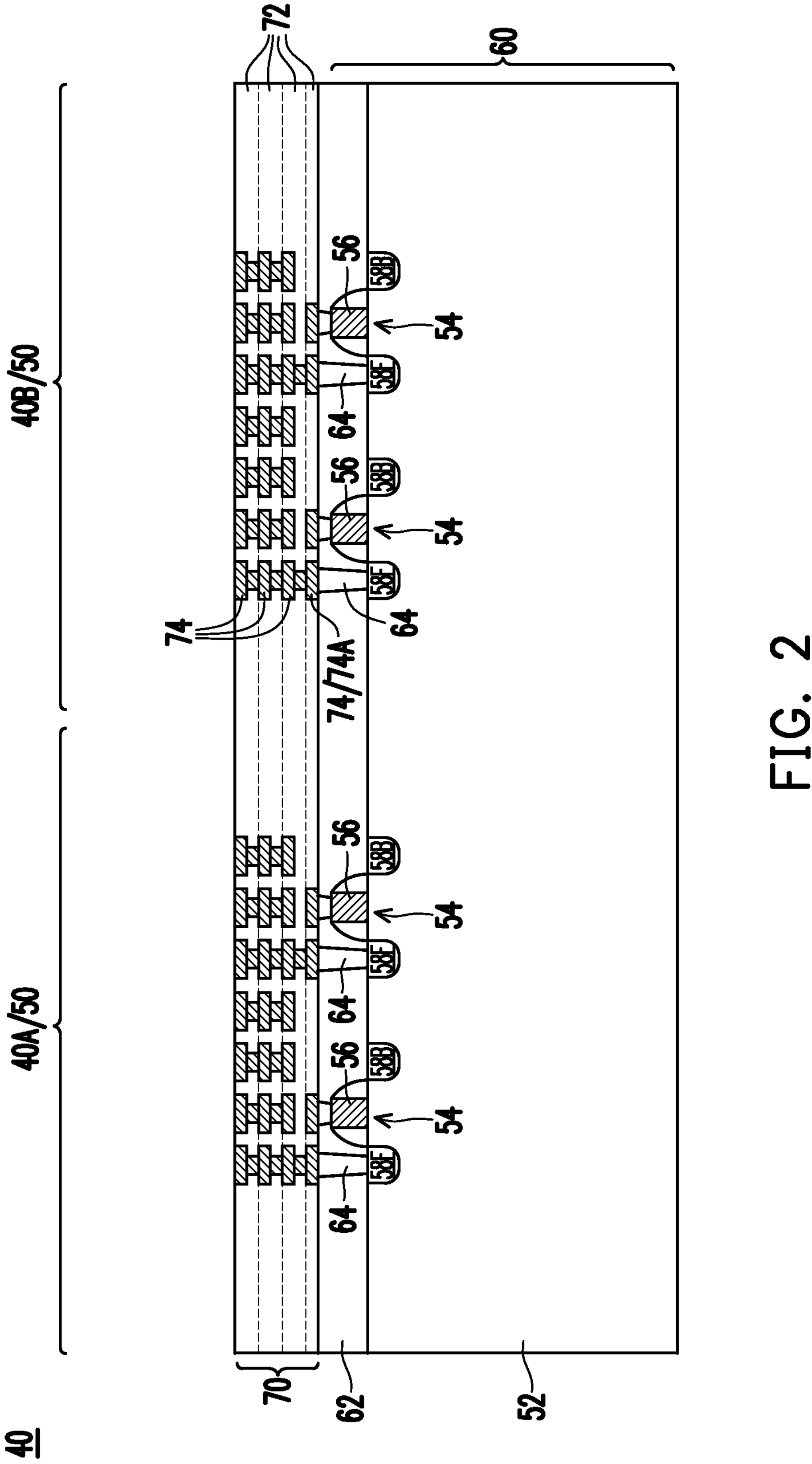

In FIG. 2, a front-side interconnect structure 70 is formed on the device layer 60, e.g., over the inter-layer dielectric 62. The front-side interconnect structure 70 is formed at a front-side of the semiconductor substrate 52/the device layer 60 (e.g., a side of the semiconductor substrate 52 on which the devices 54 are formed). The front-side interconnect structure 70 includes dielectric layers 72 and layers of conductive features 74 in the dielectric layers 72. The front-side interconnect structure 70 includes any desired number of layers of the conductive features 74. In some embodiments, the front-side interconnect structure 70 includes thirteen layers of the conductive features 74.

The dielectric layers 72 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, atomic layer deposition (ALD), or the like. The dielectric layers 72 may be formed of a low-k dielectric material having a k-value lower than about 3.0. The dielectric layers 72 may be formed of an extra-low-k (ELK) dielectric material having a k-value lower than about 2.5.

The conductive features 74 may include conductive lines and vias. The conductive vias may extend through respective ones of the dielectric layers 72 to provide vertical connections between layers of conductive lines. The conductive features 74 may be formed by a damascene process, such as a single damascene process, a dual damascene process, or the like. In a damascene process, a dielectric layer 72 is patterned utilizing photolithography and etching techniques to form interconnect openings (including trenches and via openings) corresponding to the desired pattern of the conductive features 74. The interconnect openings may then be filled with a conductive material. Suitable conductive materials include copper, silver, gold, tungsten, aluminum, combinations thereof, or the like, which may be formed by electroplating or the like.

The conductive features 74 are connected to the devices 54 (e.g., the gate structures 56 and the source/drain regions 58F) by the upper contacts 64. Therefore, the conductive features 74 are interconnects that interconnect the devices 54 to form integrated circuits (previously described). The conductive features 74 are small so that the integrated circuits may be formed to a high density.

Figure 3:
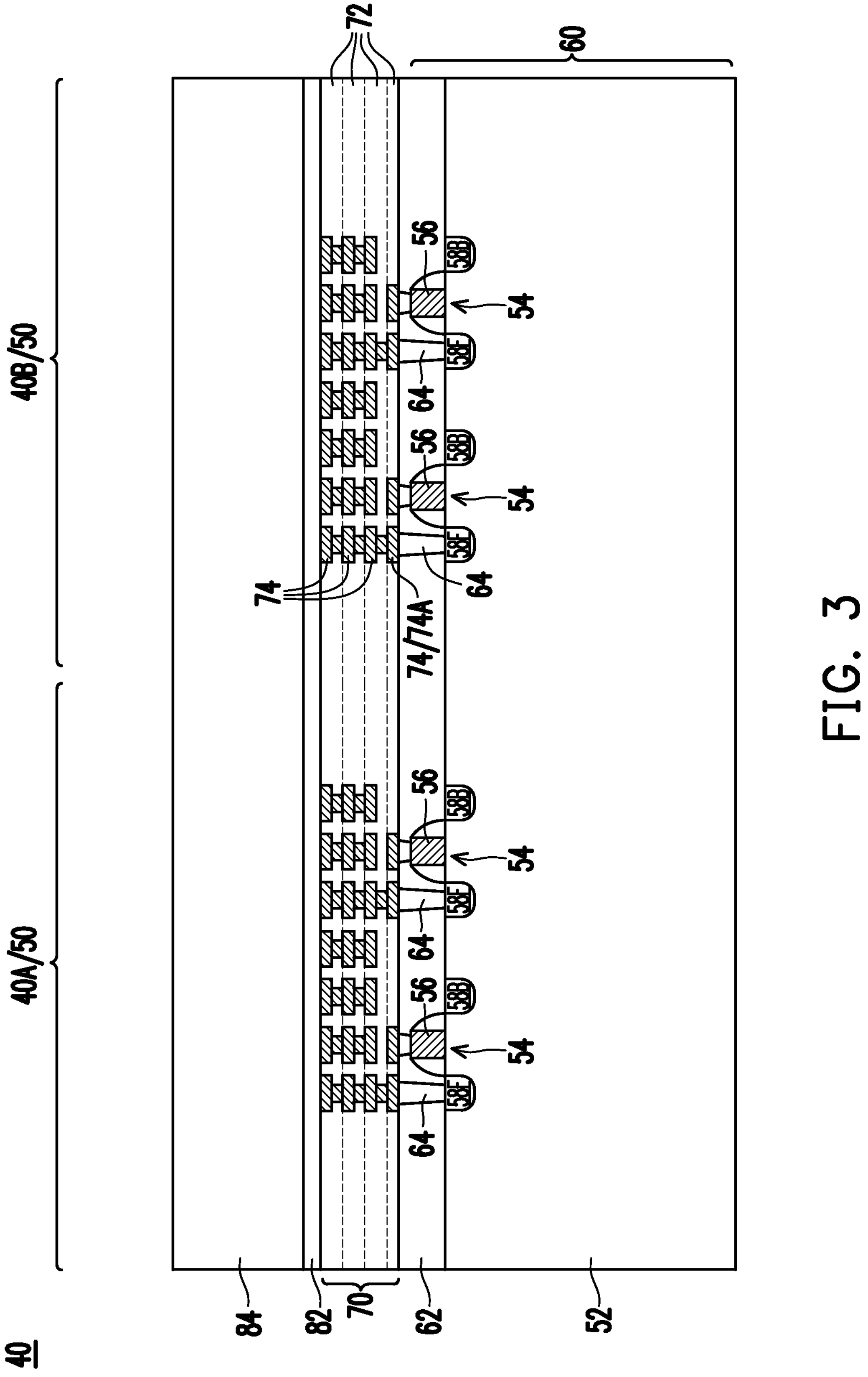

In FIG. 3, a support substrate 84 is bonded to a top surface of the front-side interconnect structure 70. The support substrate 84 may be bonded to the front-side interconnect structure 70 by one or more bonding layer(s) 82. The support substrate 84 may be a glass support substrate, a ceramic support substrate, a semiconductor substrate (e.g., a silicon substrate), a wafer (e.g., a silicon wafer), or the like. The support substrate 84 may provide structural support during subsequent processing steps and in the completed device. The support substrate 84 be substantially free of any active or passive devices.

The support substrate 84 may be bonded to the front-side interconnect structure 70 using a suitable technique such as dielectric-to-dielectric bonding, or the like. Dielectric-to-dielectric bonding may include depositing the bonding layer(s) 82 on the front-side interconnect structure 70 and/or the support substrate 84. In some embodiments, the bonding layer(s) 82 are formed of silicon oxide (e.g., a high density plasma (HDP) oxide or the like) that is deposited by CVD, ALD, or the like. The bonding layer(s) 82 may likewise include oxide layers that are formed prior to bonding using, for example, CVD, ALD, thermal oxidation, or the like. Other suitable materials may be used for the bonding layer(s) 82.

The dielectric-to-dielectric bonding process may further include performing a surface treatment on one or more of the bonding layer(s) 82. The surface treatment may include a plasma treatment. The plasma treatment may be performed in a vacuum environment. After the plasma treatment, the surface treatment may further include performing a cleaning process (e.g., a rinse with deionized water or the like) on one or more of the bonding layer(s) 82. The support substrate 84 is then aligned with the front-side interconnect structure 70 and the two are pressed against each other to initiate a pre-bonding of the support substrate 84 to the front-side interconnect structure 70. The pre-bonding may be performed at about room temperature. After the pre-bonding, an annealing process may be performed. The bonds are strengthened by the annealing process.

Figure 4:
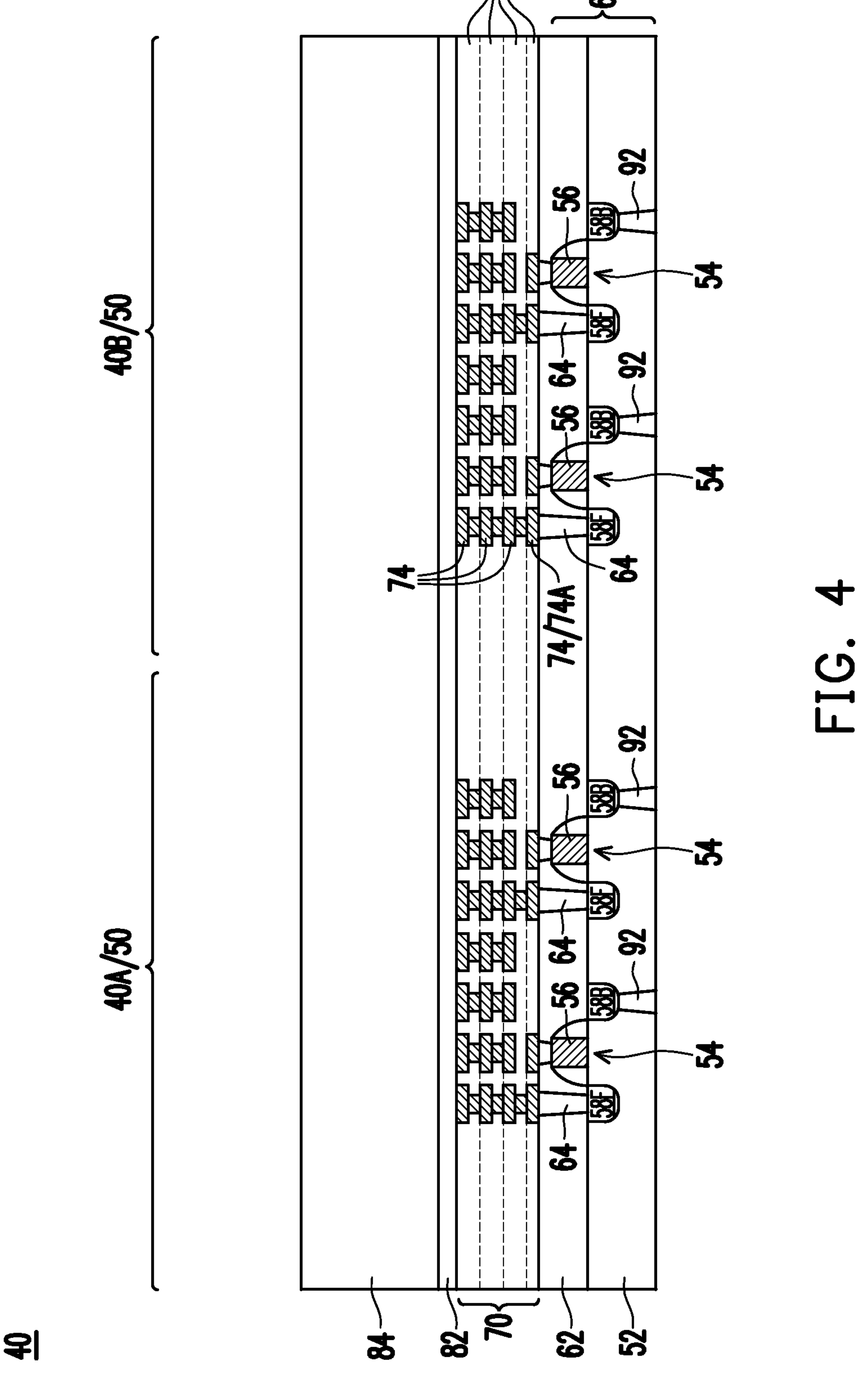

In FIG. 4, the semiconductor substrate 52 is thinned to reduce the thickness of the back-side portions of the semiconductor substrate 52. The back-side of the semiconductor substrate 52 refers to the side opposite to the front-side of the semiconductor substrate 52. The thinning process may include a mechanical grinding, a chemical mechanical polish (CMP), an etch back, combinations thereof, or the like.

Lower contacts 92 are formed through the semiconductor substrate 52 to electrically and physically couple the devices 54. Specifically, the lower contacts 92 are in contact with the back-sides of the source/drain regions 58B. As an example to form the lower contacts 92, contact openings may be formed through the semiconductor substrate 52 to expose the source/drain regions 58B. The contact openings may be formed using acceptable photolithography and etching techniques. A liner, such as a diffusion barrier layer, an adhesion layer, or the like, and a conductive material are then formed in the contact openings. The liner may include titanium, titanium nitride, tantalum, tantalum nitride, or the like. The liner may be deposited by a conformal deposition process, such as physical vapor deposition (PVD), chemical vapor deposition (CVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by PVD, CVD, or the like. A planarization process, such as a CMP, may be performed to remove excess material from the inactive surface of the semiconductor substrate 52. The remaining liner and conductive material in the contact openings forms the lower contacts 92.

Figure 5:
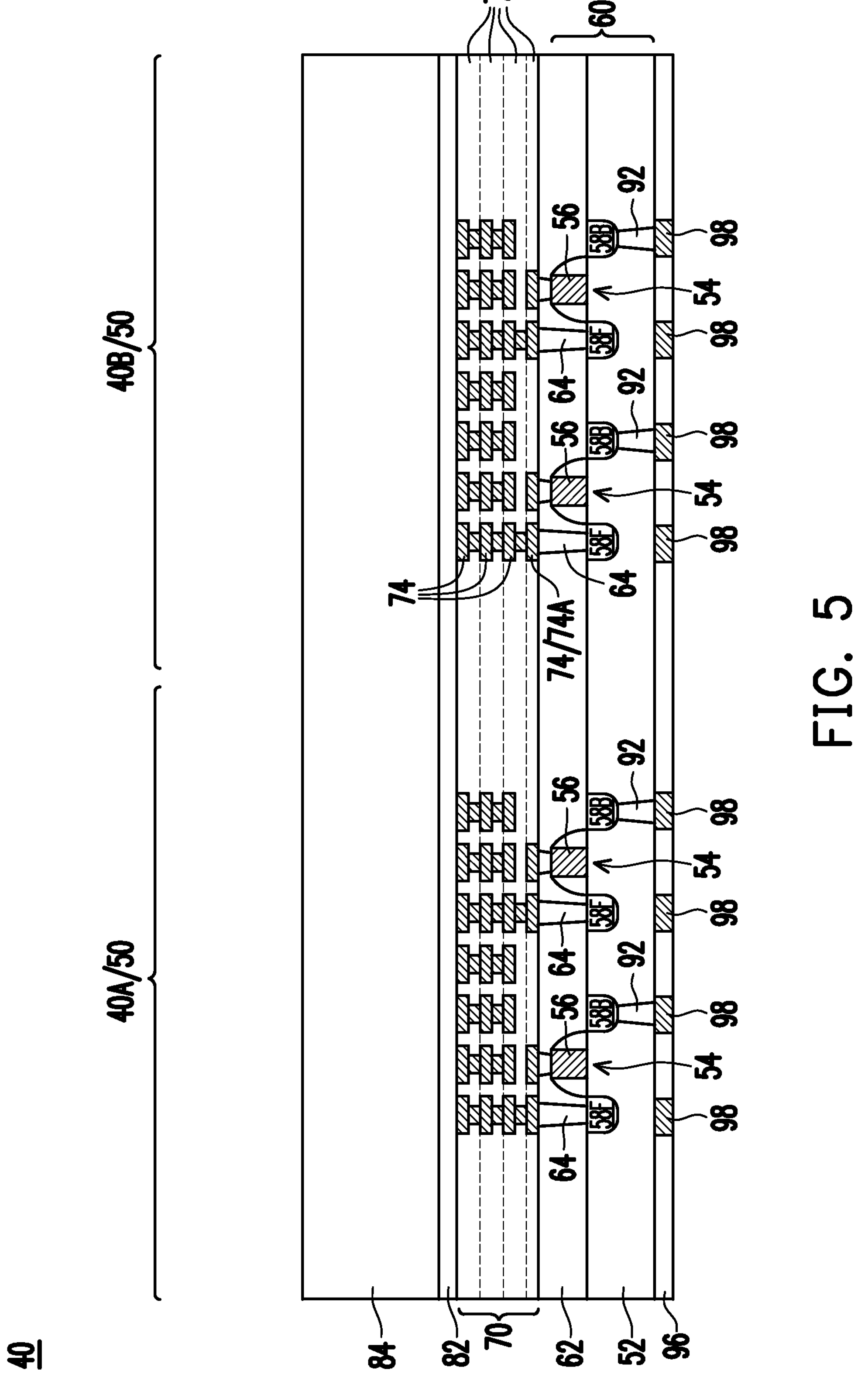

In FIG. 5, a bonding layer 96 and die connectors 98 are formed on the inactive surface of the semiconductor substrate 52. The bonding layer 96 may bury or cover the lower contacts 92, such that the top surface of the bonding layer 96 is above the surfaces of the lower contacts 92. The die connectors 98 are connected to the lower contacts 92, such that the lower contacts 92 connect the back-sides of the source/drain regions 58B to the die connectors 98. In some embodiments, no conductive features (e.g., interconnects) are interposed between the die connectors 98 and the lower contacts 92.

The bonding layer 96 is formed of a dielectric material. The dielectric material may be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric materials, such as a low temperature polyimide material, polybenzoxazole (PBO), an encapsulant, combinations thereof, or the like may also be utilized.

The die connectors 98 are formed in the bonding layer 96. The die connectors 98 may be formed by a damascene process, such as a single damascene process, a dual damascene process, or the like. In a damascene process, the bonding layer 96 is patterned utilizing photolithography and etching techniques to form openings corresponding to the desired pattern of the die connectors 98. The openings may then be filled with a conductive material. Suitable conductive materials include copper, silver, gold, tungsten, aluminum, combinations thereof, or the like, which may be formed by electroplating or the like. In some embodiments, a planarization process such as a chemical mechanical polish (CMP), an etch-back process, combinations thereof, or the like is performed on the die connectors 98 and the bonding layer 96. After the planarization process, surfaces of the die connectors 98 and the bonding layer 96 are substantially coplanar (within process variations).

Figure 6:
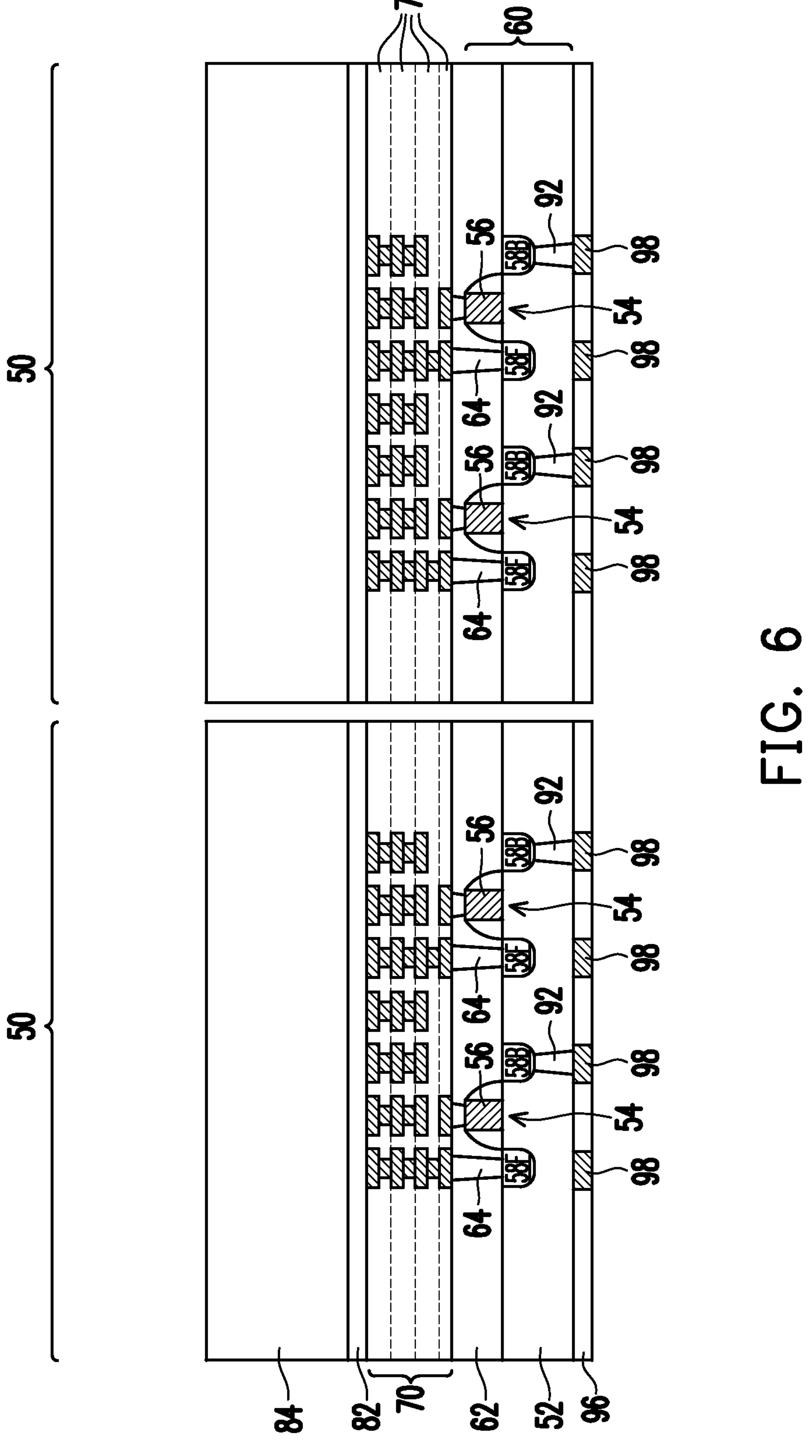

In FIG. 6, a singulation process is performed along scribe line regions of the wafer 40, e.g., between the device regions 40A, 40B of the wafer 40. The singulation process may include a sawing process, a laser cutting process, or the like. The singulation process singulates the device regions 40A, 40B of the wafer 40. The resulting, singulated integrated circuit dies 50 are from the device regions 40A, 40B. After the singulation process, the bonding layer 96, the support substrates 84, the front-side interconnect structures 70, and the device layers 60 are laterally coterminous, such that they have the same width.

As subsequently described in greater detail, multiple integrated circuit dies 50 will be bonded to a back-side interconnect structure using the bonding layers 96 and the die connectors 98. The back-side interconnect structure includes die-to-die bridges for interconnecting the integrated circuit dies 50 to form a functional system. Additionally, the back-side interconnect structure includes power distribution networks for the integrated circuit dies 50. A power distribution network includes conductive lines (e.g., power rails) for providing reference and supply voltages to the devices 54 of an integrated circuit die 50.

FIGS. 7-14 are cross-sectional views of intermediate steps during a process for forming an integrated circuit package, in accordance with some embodiments. A power distribution interposer 100 (see FIG. 8) is formed including power distribution networks. A die structure 150 is formed by bonding multiple integrated circuit dies 50 to the power distribution interposer 100 (see FIG. 10) in a device region 100D. Processing of one device region 100D is illustrated, but it should be appreciated that any number of device regions 100D can be simultaneously processed to form any number of die structures 150. The device region 100D will be singulated to form the die structure 150. The die structure 150 may be a system-on-integrated-chips (SoIC) device, although other types of devices may be formed. The die structure 150 will then be mounted to a package substrate 200 (see FIG. 14) to form the resulting integrated circuit package.

Figure 7:
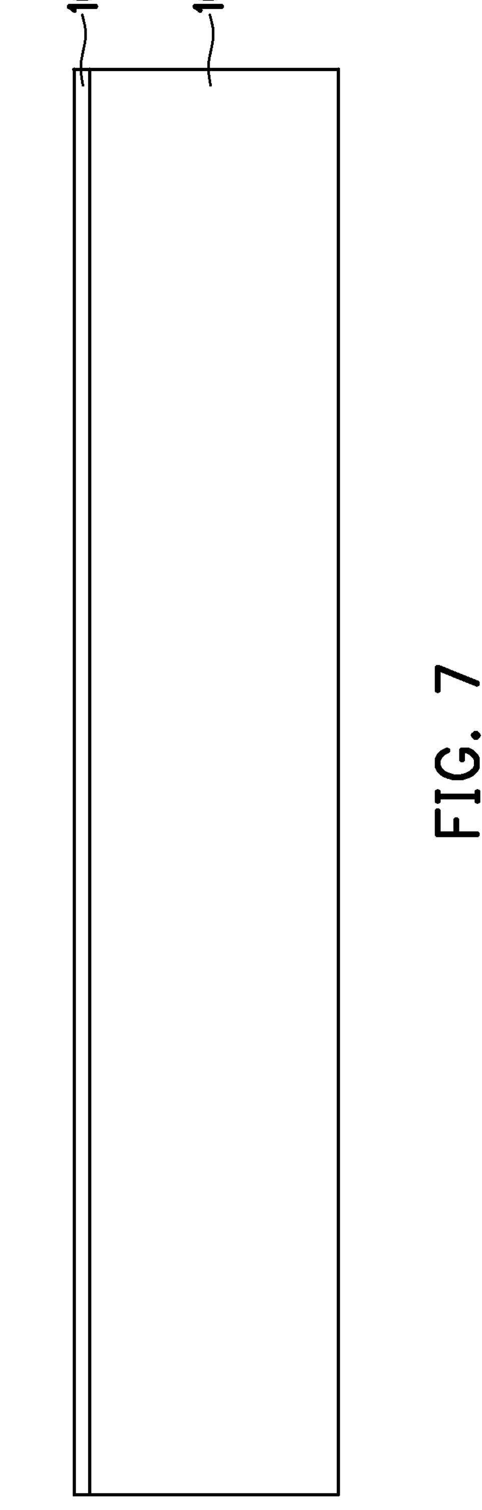
FIGS. 7-14 are cross-sectional views of intermediate steps during a process for forming an integrated circuit package, in accordance with some embodiments.

In FIG. 7, a first carrier substrate 102 is provided, and a release layer 104 is formed on the first carrier substrate 102. The first carrier substrate 102 may be a glass carrier substrate, a ceramic carrier substrate, or the like. A power distribution interposer will be formed on the first carrier substrate 102. The first carrier substrate 102 may be a wafer, such that multiple power distribution interposers can be formed on the first carrier substrate 102 simultaneously.

The release layer 104 may be formed of a polymer-based material, which may be removed along with the first carrier substrate 102 from the interconnect structure that will be formed in subsequent steps. In some embodiments, the release layer 104 is an epoxy-based thermal-release material, which loses its adhesive property when heated, such as a light-to-heat-conversion (LTHC) release coating. In some embodiments, the release layer 104 may is an ultra-violet (UV) glue, which loses its adhesive property when exposed to UV light. The release layer 104 may be dispensed as a liquid and cured, may be a laminate film laminated onto the first carrier substrate 102, or may be the like. The top surface of the release layer 104 may be leveled and may have a high degree of planarity.

Figure 8:
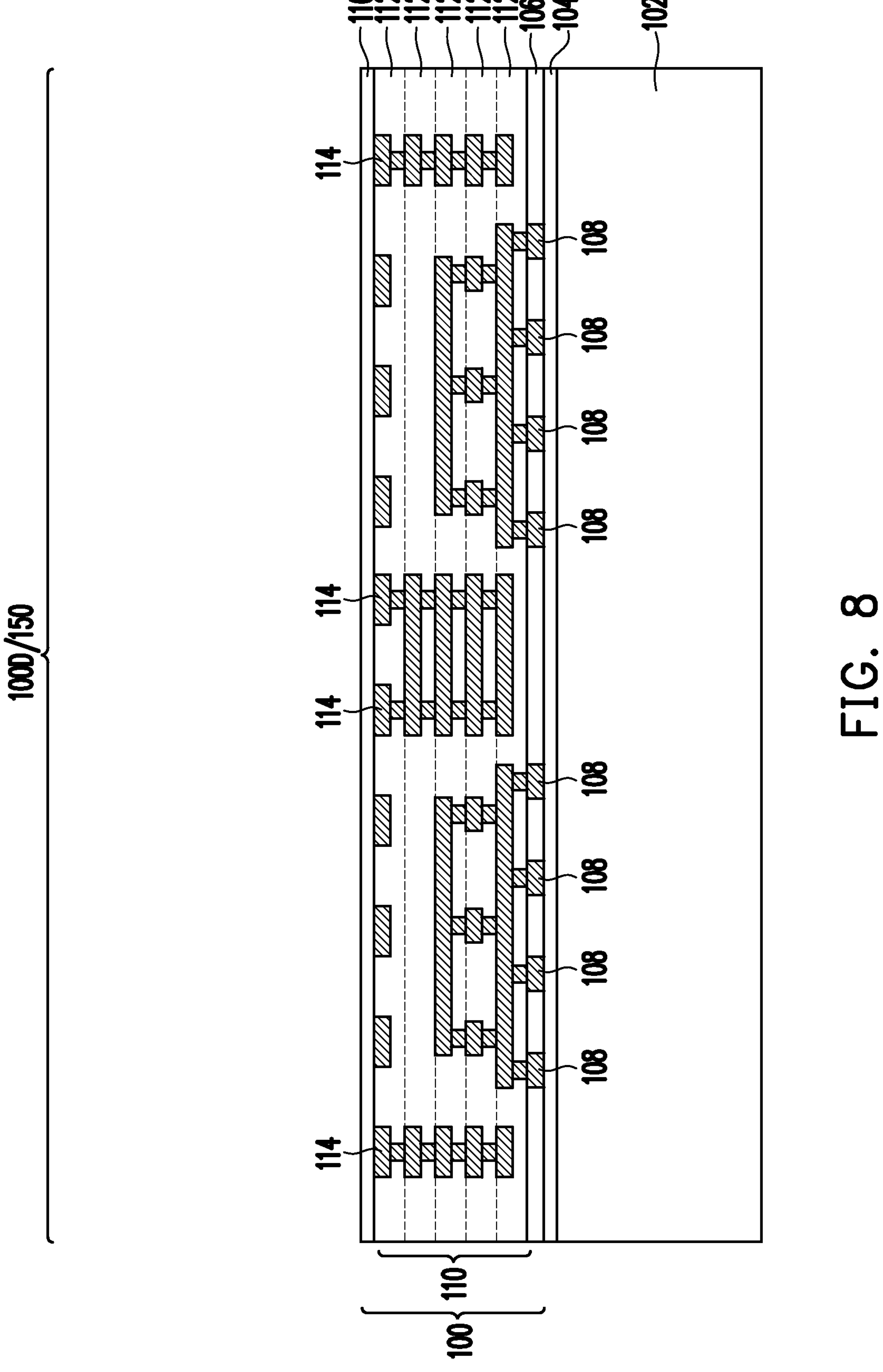

In FIG. 8, a power distribution interposer 100 is formed on the first carrier substrate 102. The power distribution interposer 100 includes a bonding layer 106, die connectors 108, a back-side interconnect structure 110, and one or more passivation layer(s) 116. Additional features of the power distribution interposer 100 will be formed after a subsequent de-bonding of the first carrier substrate 102. The power distribution interposer 100 is free of through-substrate vias (TSVs), which may reduce the size of the resulting die structure 150. As subsequently described for FIG. 10, the power distribution interposer 100 will be attached to back-sides of the integrated circuit dies 50.

The bonding layer 106 is formed on the release layer 104. The bonding layer 106 is formed of a dielectric material. The dielectric material may be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric materials, such as a low temperature polyimide material, polybenzoxazole (PBO), an encapsulant, combinations thereof, or the like may also be utilized. The bonding layer 106 may (or may not) be formed of the same dielectric material as the bonding layer 96.

The die connectors 108 are formed in the bonding layer 106. The die connectors 108 may be formed by a damascene process, such as a single damascene process, a dual damascene process, or the like. In a damascene process, the bonding layer 106 is patterned utilizing photolithography and etching techniques to form openings corresponding to the desired pattern of the die connectors 108. The openings may then be filled with a conductive material. Suitable conductive materials include copper, silver, gold, tungsten, aluminum, combinations thereof, or the like, which may be formed by electroplating or the like. In some embodiments, a planarization process such as a chemical mechanical polish (CMP), an etch-back process, combinations thereof, or the like is performed on the die connectors 108 and the bonding layer 106. After the planarization process, surfaces of the die connectors 108 and the bonding layer 106 are substantially coplanar (within process variations). The die connectors 108 may (or may not) be formed of the same conductive material as the die connectors 98.

The back-side interconnect structure 110 is formed on the bonding layer 106. The back-side interconnect structure 110 includes dielectric layers 112 and layers of conductive features 114 in the dielectric layers 112. The back-side interconnect structure 110 includes any desired number of layers of the conductive features 114. In some embodiments, the back-side interconnect structure 110 includes five layers of the conductive features 114.

The dielectric layers 112 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, ALD, or the like. The dielectric layers 112 may be formed of a low-k dielectric material having a k-value lower than about 3.0. The dielectric layers 112 may be formed of an extra-low-k (ELK) dielectric material having a k-value lower than about 2.5.

The conductive features 114 may include conductive lines and vias. The conductive vias may extend through respective ones of the dielectric layers 112 to provide vertical connections between layers of conductive lines. The conductive features 114 may be formed by a damascene process, such as a single damascene process, a dual damascene process, or the like. In a damascene process, a dielectric layer 112 is patterned utilizing photolithography and etching techniques to form interconnect openings (including trenches and via openings) corresponding to the desired pattern of the conductive features 114. The interconnect openings may then be filled with a conductive material. Suitable conductive materials include copper, silver, gold, tungsten, aluminum, combinations thereof, or the like, which may be formed by electroplating or the like.

The conductive features 114 form power distribution networks for integrated circuit dies. The conductive features 114 are large so that the power distribution network may have a low resistance. In some embodiments, the conductive features 114 have a minimum feature size of about 65 nm. The back-side interconnect structure 110 and the front-side interconnect structures 70 (see FIG. 2) are formed in processes of different technology nodes. The technology node of the process for forming the back-side interconnect structure 110 is larger than the technology node of the process for forming the front-side interconnect structures 70.

The passivation layer(s) 116 are formed on the back-side interconnect structure 110. The passivation layer(s) 116 may be formed of one or more acceptable dielectric materials, such as silicon oxide, silicon nitride, low-k (LK) dielectrics such as carbon doped oxides, extremely low-k (ELK) dielectrics such as porous carbon doped silicon dioxide, combinations thereof, or the like. Other acceptable dielectric materials include photosensitive polymers such as polyimide, polybenzoxazole (PBO), a benzocyclobutene (BCB) based polymer, combinations thereof, or the like. The passivation layer(s) 116 may be formed by deposition (e.g., CVD), spin coating, lamination, combinations thereof, or the like.

Figure 9:
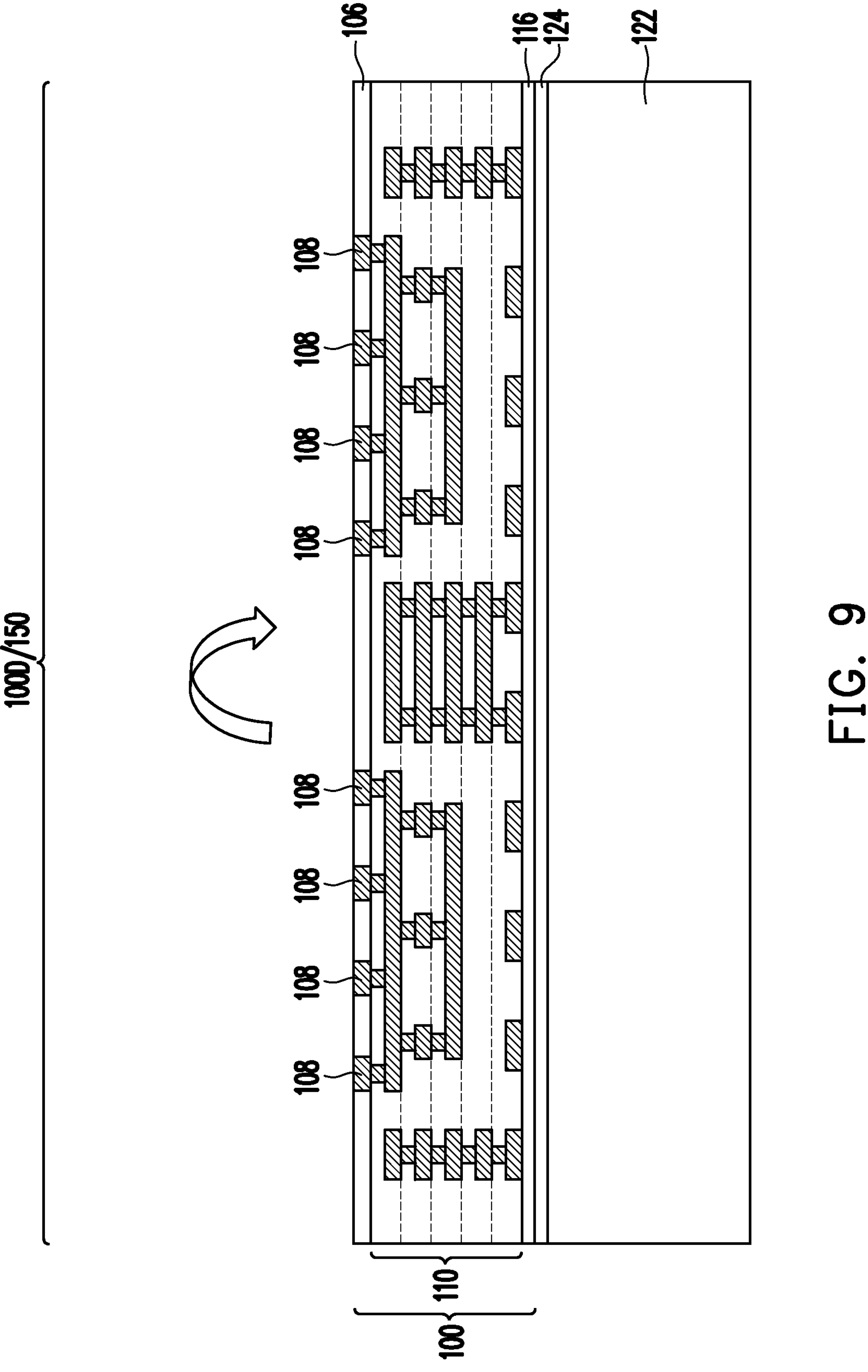

In FIG. 9, a carrier substrate de-bonding is performed to detach (or "de-bond") the first carrier substrate 102 from the power distribution interposer 100. In some embodiments, the de-bonding includes projecting a light such as a laser light or a UV light on the release layer 104 so that the release layer 104 decomposes under the heat of the light and the first carrier substrate 102 can be removed. The structure is then flipped over and bonded to a second carrier substrate 122.

The second carrier substrate 122 is bonded to a top surface of the power distribution interposer 100, e.g., to a top surface of the passivation layer(s) 116. The second carrier substrate 122 may be bonded to the power distribution interposer 100 by one or more bonding layer(s) 124. The second carrier substrate 122 may be a glass carrier substrate, a ceramic carrier substrate, or the like. The second carrier substrate 122 may be a wafer, such that multiple die structures can be formed on the second carrier substrate 122 simultaneously.

The second carrier substrate 122 may be bonded to the power distribution interposer 100 using a suitable technique such as dielectric-to-dielectric bonding, or the like. Dielectric-to-dielectric bonding may include depositing the bonding layer(s) 124 on the power distribution interposer 100 and/or the second carrier substrate 122. In some embodiments, the bonding layer(s) 124 are formed of silicon oxide (e.g., a high density plasma (HDP) oxide or the like) that is deposited by CVD, ALD, or the like. The bonding layer(s) 124 may likewise include oxide layers that are formed prior to bonding using, for example, CVD, ALD, thermal oxidation, or the like. Other suitable materials may be used for the bonding layer(s) 124.

The dielectric-to-dielectric bonding process may further include performing a surface treatment on one or more of the bonding layer(s) 124. The surface treatment may include a plasma treatment. The plasma treatment may be performed in a vacuum environment. After the plasma treatment, the surface treatment may further include performing a cleaning process (e.g., a rinse with deionized water or the like) on one or more of the bonding layer(s) 124. The second carrier substrate 122 is then aligned with the power distribution interposer 100 and the two are pressed against each other to initiate a pre-bonding of the second carrier substrate 122 to the power distribution interposer 100. The pre-bonding may be performed at about room temperature. After the pre-bonding, an annealing process may be performed. The bonds are strengthened by the annealing process.

Figure 10:
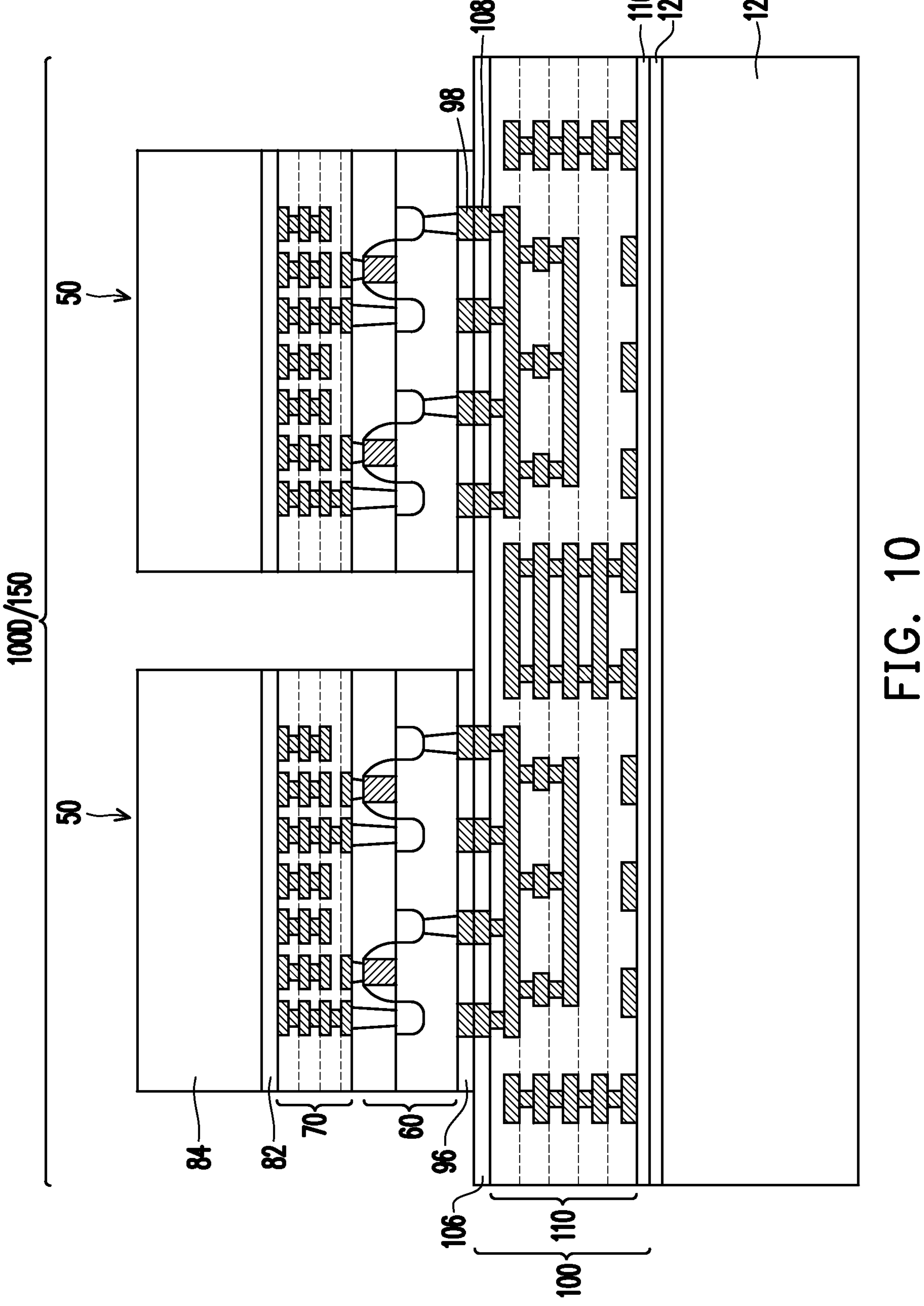

In FIG. 10, multiple integrated circuit dies 50 are attached to the power distribution interposer 100 using the bonding layer 106 and the die connectors 108, such that the back-sides of the integrated circuit dies 50 face the back-side interconnect structure 110. Each of the integrated circuit dies 50 attached to the power distribution interposer 100 may have a different or same function. Additionally, each of the integrated circuit dies 50 may be formed in processes of a same technology node, or may be formed in processes of different technology nodes. In the illustrated embodiment, two integrated circuit dies 50 are attached in the device region 100D, although any desired quantity of integrated circuit dies 50 may be attached in the device region 100D.

The integrated circuit dies 50 may be attached to the power distribution interposer 100 by placing the integrated circuit dies 50 on the bonding layer 106 and the die connectors 108, then bonding the integrated circuit dies 50 to the bonding layer 106 and the die connectors 108. The integrated circuit dies 50 may be placed by, e.g., a pick-and-place process. As an example of the bonding process, the integrated circuit dies 50 may be bonded to the bonding layer 106 and the die connectors 108 by hybrid bonding. The bonding layers 96 of the integrated circuit dies 50 are directly bonded to the bonding layer 106 through dielectric-to-dielectric bonding, without using any adhesive material (e.g., die attach film). The die connectors 98 of the integrated circuit dies 50 are directly bonded to respective die connectors 108 through metal-to-metal bonding, without using any eutectic material (e.g., solder). The bonding may include a pre-bonding and an annealing. During the pre-bonding, a small pressing force is applied to press the integrated circuit dies 50 (e.g., the bonding layers 96) against the power distribution interposer 100 (e.g., the bonding layer 106). The pre-bonding is performed at a low temperature, such as about room temperature, and after the pre-bonding, the bonding layers 96 are bonded to the bonding layer 106. The bonding strength is then improved in a subsequent annealing step, in which the bonding layer 106, the die connectors 108, the bonding layers 96, and the die connectors 98 are annealed. After the annealing, direct bonds such as fusion bonds are formed, bonding the bonding layer 106 to the bonding layers 96. For example, the bonds can be covalent bonds between the material of the bonding layer 106 and the material of the bonding layers 96. The die connectors 108 are connected to the die connectors 98 with a one-to-one correspondence. The die connectors 108 and the die connectors 98 may be in physical contact after the pre-bonding, or may expand to be brought into physical contact during the annealing. Further, during the annealing, the material(s) of the die connectors 108 and the die connectors 98 (e.g., copper) intermingles, so that metal-to-metal bonds are also formed. Hence, the resulting bonds between the integrated circuit dies 50, the bonding layer 106, the die connectors 108 are hybrid bonds that include both dielectric-to-dielectric bonds and metal-to-metal bonds.

In this embodiment, singulated integrated circuit dies 50 are attached to the power distribution interposer 100 in a chip-on-wafer bonding process. As a result, the back-side interconnect structure 110 is wider than the front-side interconnect structures 70. Other bonding processes may be utilized. In another embodiment (subsequently described for FIG. 15), a wafer including unsingulated integrated circuit dies 50 is attached to the power distribution interposer 100 in a wafer-on-wafer bonding process.

Figure 11:
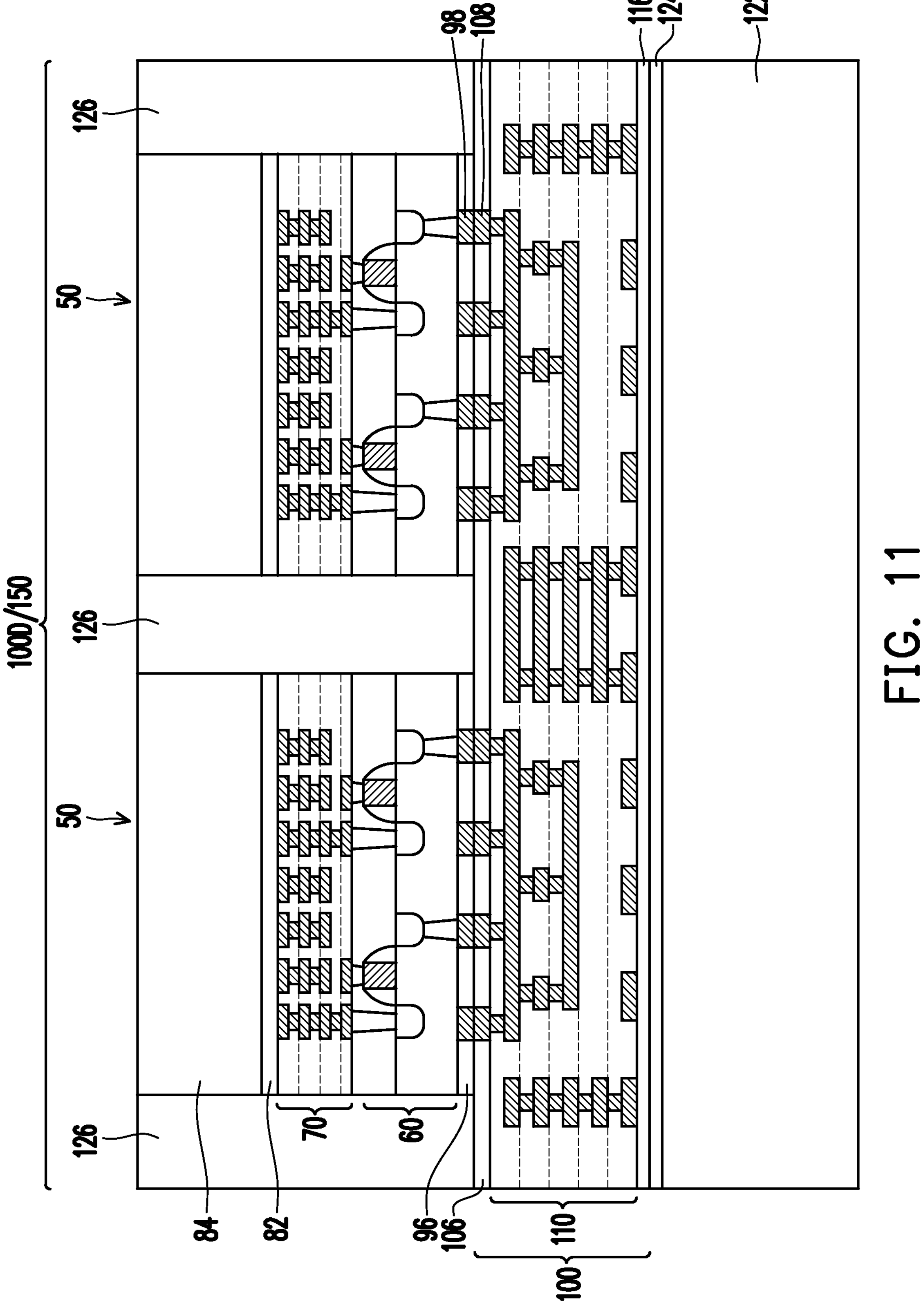

In FIG. 11, a gap-filling dielectric 126 is formed between the integrated circuit dies 50 in the device region 100D. The gap-filling dielectric 126 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Initially, the gap-filling dielectric 126 may bury or cover the integrated circuit dies 50, such that the top surface of the gap-filling dielectric 126 is above the support substrates 84. A removal process may be performed to level surfaces of the gap-filling dielectric 126 with the front-side surfaces of the integrated circuit dies 50. In some embodiments, a planarization process such as a chemical mechanical polish (CMP), an etch-back process, combinations thereof, or the like is utilized. After the planarization process, surfaces of the gap-filling dielectric 126 and the integrated circuit dies 50 are substantially coplanar (within process variations). In this embodiment, the bonding layer(s) 82 and the support substrates 84 remain after the removal process. As such, surfaces of the gap-filling dielectric 126 and the support substrates 84 are substantially coplanar (within process variations). In another embodiment (subsequently described for FIG. 17), the bonding layer(s) 82 and/or the support substrates 84 are removed by the removal process.

Figure 12:
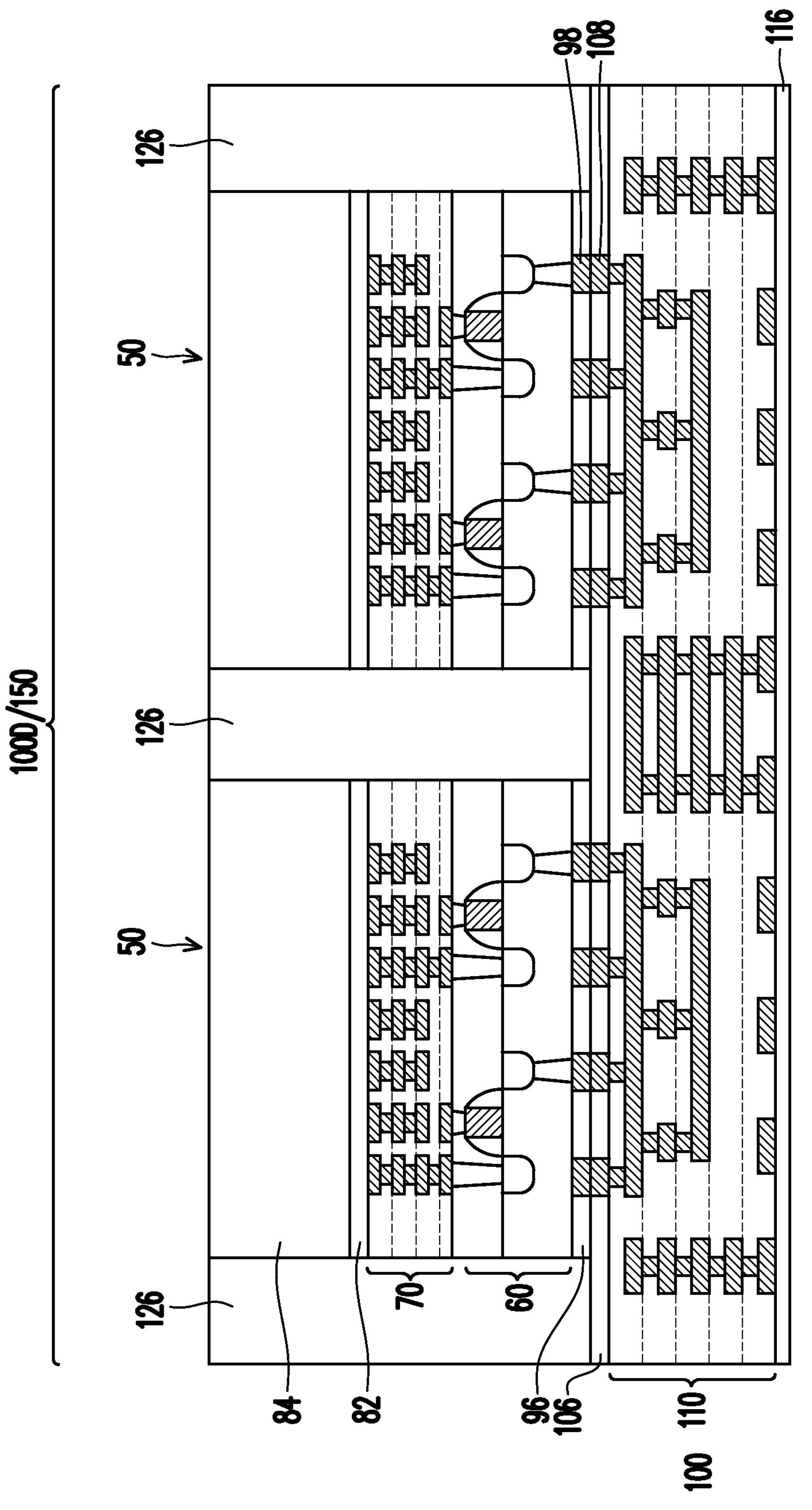

In FIG. 12, a carrier substrate de-bonding is performed to detach (or "de-bond") the second carrier substrate 122 from the power distribution interposer 100. In some embodiments, the de-bonding includes removing the second carrier substrate 122 and the bonding layer(s) 124 with a suitable removal process. In some embodiments, a planarization process such as a chemical mechanical polish (CMP), an etch-back process, combinations thereof, or the like is utilized.

In this embodiment, the passivation layer(s) 116 are formed before the de-bonding of the first carrier substrate 102 (see FIG. 9). The passivation layer(s) 116 may be used as a stop layer during the removal of the second carrier substrate 122. In another embodiment, the passivation layer(s) 116 are formed after the de-bonding of the second carrier substrate 122.

Figure 13:
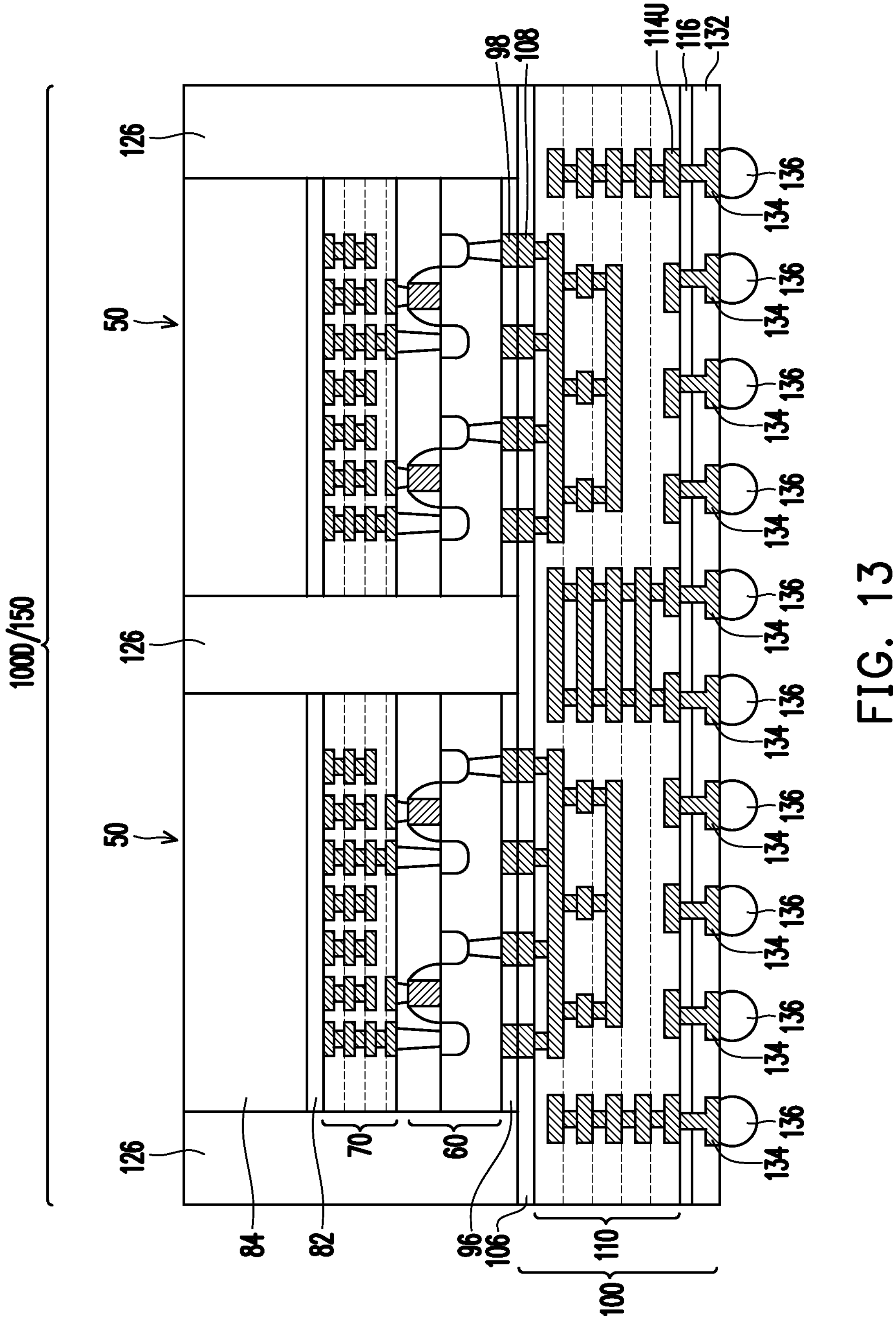

In FIG. 13, a dielectric layer 132 is formed on the top surface of the passivation layer(s) 116. The dielectric layer 132 may be formed of one or more acceptable dielectric materials, such as photosensitive polymers, such as polyimide, polybenzoxazole (PBO), a benzocyclobutene (BCB) based polymer, combinations thereof, or the like. Other acceptable dielectric materials include silicon oxide, silicon nitride, low-k (LK) dielectrics such as carbon doped oxides, extremely low-k (ELK) dielectrics such as porous carbon doped silicon dioxide, combinations thereof, or the like. The dielectric layer 132 may be formed by spin coating, lamination, deposition (e.g., CVD), combinations thereof, or the like.

External connectors 134 are formed in the dielectric layer 132 and the passivation layer(s) 116. The external connectors 134 are electrically and physically coupled to the upper conductive features 114U of the back-side interconnect structure 110. The external connectors 134 may include conductive pillars, pads, or the like, to which external connections can be made. In some embodiments, the external connectors 134 include bond pads at a top surface of the dielectric layer 132, and include bond pad vias that connect the bond pads to the upper conductive features 114U of the back-side interconnect structure 110. In such embodiments, the external connectors 134 (including the bond pads and the bond pad vias) may be formed by a damascene process, such as a single damascene process, a dual damascene process, or the like. The external connectors 134 can be formed of a conductive material, such as a metal, such as copper, aluminum, or the like, which can be formed by, for example, plating, or the like. In some embodiments, a planarization process such as a chemical mechanical polish (CMP), an etch-back process, combinations thereof, or the like is performed on the external connectors 134 and the dielectric layer 132. After the planarization process, top surfaces of external connectors 134 and the dielectric layer 132 are substantially coplanar (within process variations).

Reflowable connectors 136 are formed on the external connectors 134. The reflowable connectors 136 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The reflowable connectors 136 may include a conductive material such as solder, copper, aluminum, gold, nickel, silver, palladium, tin, the like, or a combination thereof. In some embodiments, the reflowable connectors 136 are formed by initially forming a layer of solder through evaporation, electroplating, printing, solder transfer, ball placement, or the like. Once a layer of solder has been formed, a reflow may be performed in order to shape the material into the desired bump shapes. In another embodiment, the reflowable connectors 136 include metal pillars (such as copper pillars) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 14:
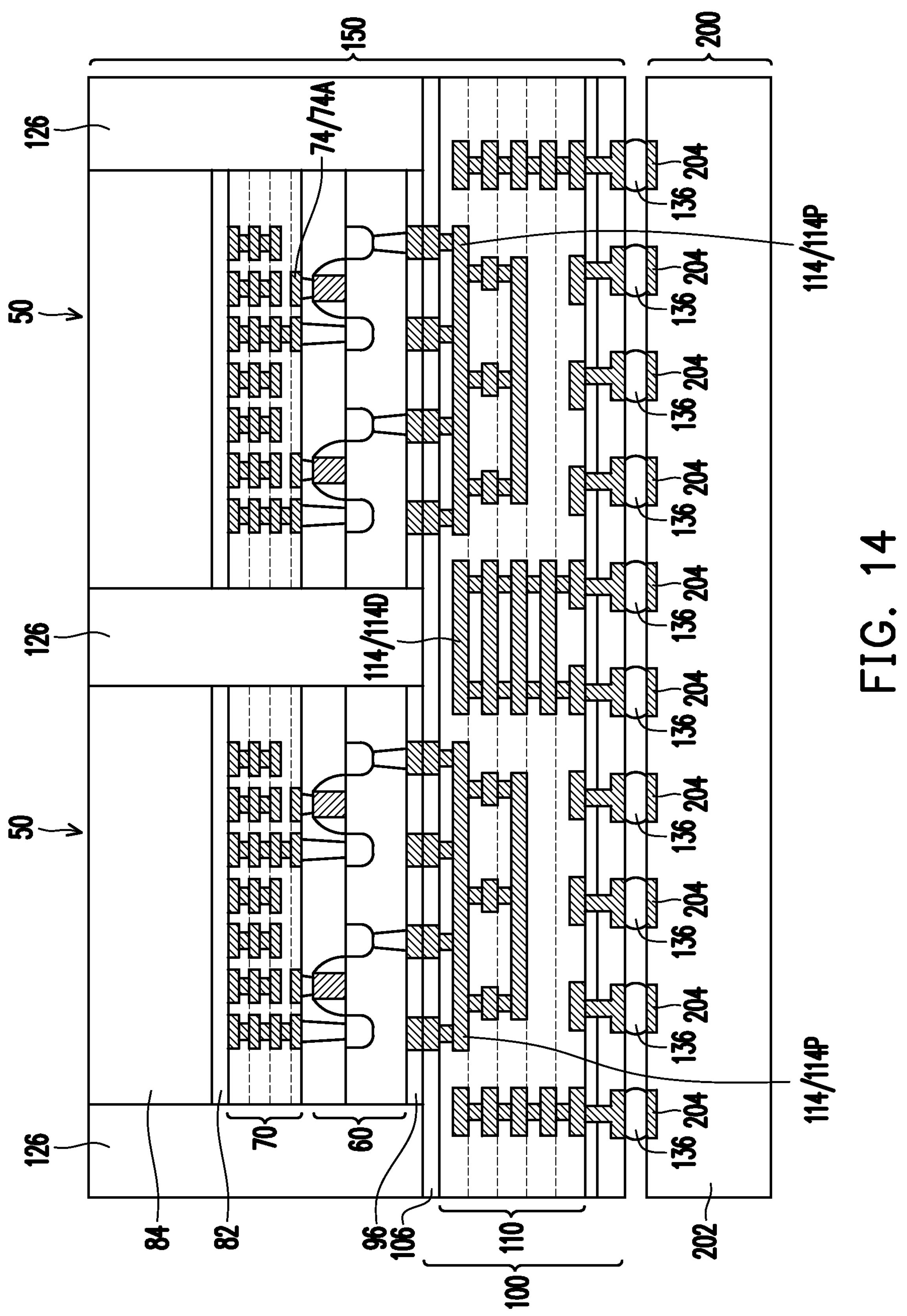

In FIG. 14, a singulation process is performed along scribe line regions, e.g., between the device region 100D and adjacent device regions (not separately illustrated). The singulation process may include a sawing process, a laser cutting process, or the like. The singulation process singulates the device region 100D from the adjacent device regions. The resulting, singulated die structure 150 is from the device region 100D. After the singulation process, the power distribution interposer 100 and the gap-filling dielectric 126 are laterally coterminous, such that they have the same width.

The die structure 150 is then mounted to a package substrate 200 using the reflowable connectors 136. The package substrate 200 includes a substrate core 202 and bond pads 204 over the substrate core 202. The substrate core 202 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may be used. Additionally, the substrate core 202 may be an SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto Build-Up Film (ABF) or other laminates may be used for substrate core 202.

The substrate core 202 may include active and passive devices (not separately illustrated). A wide variety of devices such as transistors, capacitors, resistors, combinations of these, and the like may be used to generate the structural and functional requirements of the design for the integrated circuit package. The devices may be formed using any suitable methods.

The substrate core 202 may also include metallization layers and vias, with the bond pads 204 being physically and/or electrically coupled to the metallization layers and vias. The metallization layers may be formed over the active and passive devices and are designed to connect the various devices to form integrated circuits. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 202 is substantially free of active and passive devices.

In some embodiments, the reflowable connectors 136 are reflowed to attach the die structure 150 to the bond pads 204. The reflowable connectors 136 electrically and/or physically couple the package substrate 200, including metallization layers in the substrate core 202, to the die structure 150, including the conductive features 114 of the back-side interconnect structure 110. In some embodiments, a solder resist (not separately illustrated) is formed on the substrate core 202. The reflowable connectors 136 may be disposed in openings in the solder resist to be electrically and physically coupled to the bond pads 204. The solder resist may be used to protect areas of the substrate core 202 from external damage.

The reflowable connectors 136 may have an epoxy flux (not separately illustrated) formed thereon before they are reflowed with at least some of the epoxy portion of the epoxy flux remaining after the die structure 150 is attached to the package substrate 200. This remaining epoxy portion may act as an underfill to reduce stress and protect the joints resulting from reflowing the reflowable connectors 136. In some embodiments, an underfill (not separately illustrated) is formed between the die structure 150 and the package substrate 200 and surrounding the reflowable connectors 136. The underfill may be formed by a capillary flow process after the die structure 150 is attached or may be formed by a suitable deposition method before the die structure 150 is attached.

In some embodiments, passive devices (e.g., surface mount devices (SMDs), not separately illustrated) may also be attached to the package substrate 200 (e.g., to the bond pads 204). For example, the passive devices may be bonded to a same surface of the package substrate 200 as the reflowable connectors 136. The passive devices may be attached to the package substrate 200 prior to or after mounting the die structure 150 on the package substrate 200.

Alternatively, the die structure 150 may be mounted to another component, such as an interposer (not separately illustrated). The interposer may then be mounted to the package substrate 200. The resulting integrated circuit package may be a chip-on-wafer-on-substrate (CoWoS) package, although other types of packages may be formed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As noted above, the back-side interconnect structure 110 includes power distribution networks for the integrated circuit dies 50. Some of the conductive features 114 are power rails 114P, which are conductive lines of the power distribution networks. The power rails 114P are used to electrically couple some of the source/drain regions 58B to a reference voltage, supply voltage, or the like. For example, the power rails 114P are connected to some of the die connectors 108, which are connected to the die connectors 98, which are connected to the lower contacts 92, which are connected to some of the source/drain regions 58B (see FIG. 6). The integrated circuit dies 50 are free of power rails, e.g., do not include any conductive lines of the power distribution networks. Instead, the back-side interconnect structure 110 includes all of the power rails of the power distribution networks for the integrated circuit dies 50. Omitting power rails from the integrated circuit dies 50 and instead forming the power rails 114P in the back-side interconnect structure 110 allows the interconnect density of the integrated circuit dies 50 to be increased. Further, the back-side interconnect structure 110 may accommodate wider power rails than the front-side interconnect structure 70, reducing resistance and increasing efficiency of power delivery to the integrated circuit dies 50. For example, a width of a first level conductive line (e.g., power rail 114P) of the back-side interconnect structure 110 may be at least twice a width of the first level conductive lines (e.g., conductive lines 74A) of the front-side interconnect structures 70. More generally, the minimum feature size of the conductive features 114 is greater than the minimum feature size of the conductive features 74.

Additionally, the back-side interconnect structure 110 includes die-to-die bridges for interconnecting the integrated circuit dies 50. Some of the conductive features 114 may be data rails 114D, which are conductive lines of the die-to-die bridges. The data rails 114D are used to electrically couple the device layer 60 (e.g., some of the source/drain regions 58B) of one integrated circuit die 50 to the device layer 60 (e.g., some of the source/drain regions 58B) of another integrated circuit die 50. For example, the data rails 114D are connected to some of the die connectors 108, which are connected to the die connectors 98, which are connected to the lower contacts 92, which are connected to some of the source/drain regions 58B (see FIG. 6). The integrated circuit dies 50 are free of die bridges, e.g., do not include any conductive lines of the die-to-die bridges. Instead, the back-side interconnect structure 110 includes all of the data rails of the die-to-die bridges for interconnecting the integrated circuit dies 50. The back-side interconnect structure 110 may thus be utilized in lieu of bridge dies, such as local silicon interconnect dies, which may reduce the size of the die structure 150. The data rails 114D are long enough to extend between the integrated circuit dies 50. For example, a length of a first level conductive line (e.g., data rail 114D) of the back-side interconnect structure 110 may be at least twice a length of the first level conductive lines (e.g., conductive lines 74A) of the front-side interconnect structures 70.

The back-side interconnect structure 110 is a shared interconnect structure for the integrated circuit dies 50. As noted above, the back-side interconnect structure 110 is initially formed on the first carrier substrate 102 (see FIG. 8) and then flipped (see FIG. 9) before the integrated circuit dies 50 are attached (see FIG. 10). As a result of this, the size (e.g., thickness and/or width) of the conductive features 114 in each layer of the back-side interconnect structure 110 may increase in a direction extending away from the back-sides of the of the device layers 60. Similarly, the size of the conductive features 74 in each layer of the front-side interconnect structures 70 may increase in a direction extending away from the front-sides of the device layers 60.

Figure 15:
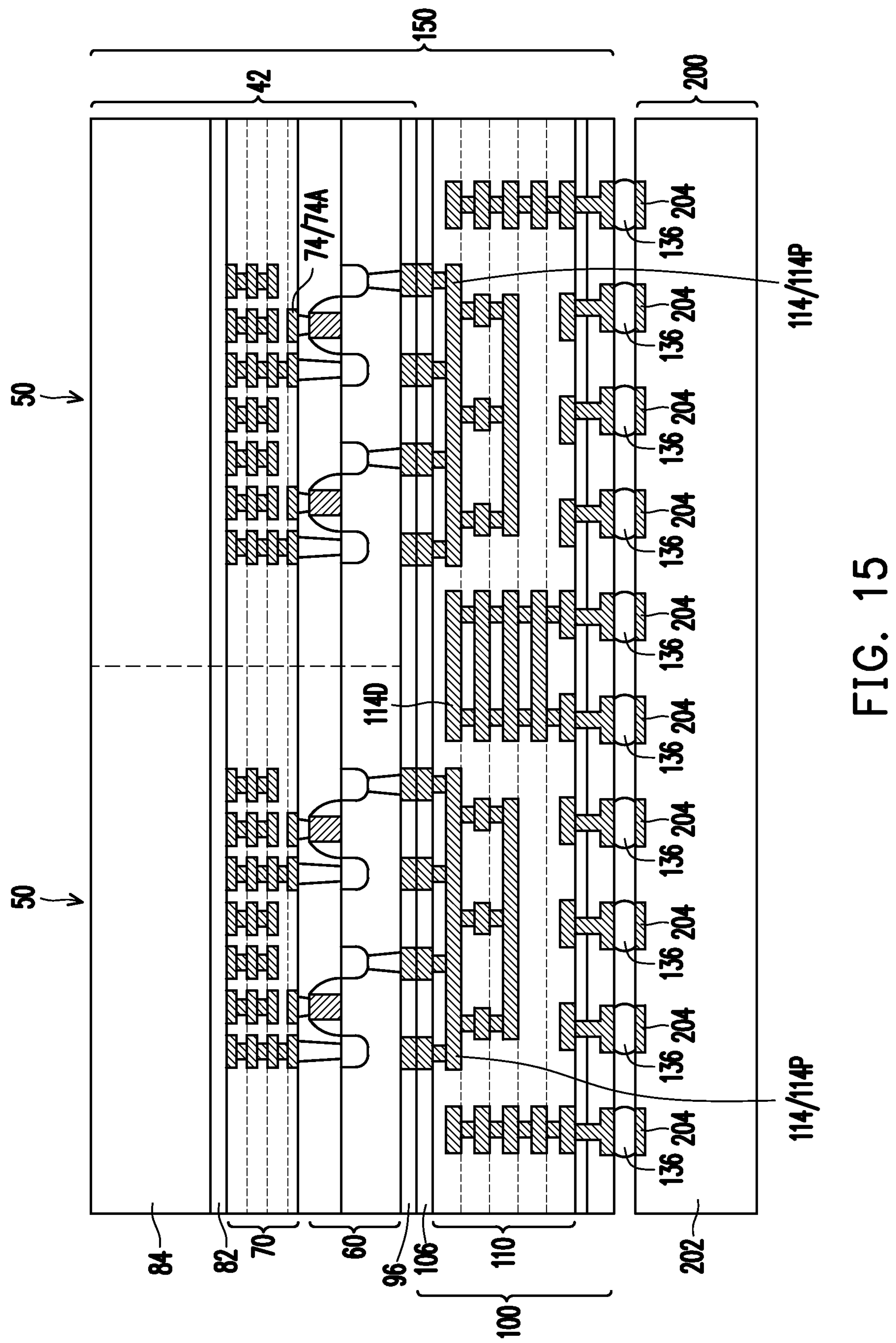
FIG. 15 is a cross-sectional view of an integrated circuit package, in accordance with some embodiments.

FIG. 15 is a cross-sectional view of an integrated circuit package, in accordance with some embodiments. This embodiment is similar to the embodiment of FIG. 14, except the wafer 40 (see FIG. 5) is not singulated before the integrated circuit dies 50 are attached to the power distribution interposer 100. Instead, the wafer 40 including the unsingulated integrated circuit dies 50 is attached to the power distribution interposer 100. The wafer 40 may be bonded to the power distribution interposer 100 by hybrid bonding, in a similar manner as the bonding of the singulated integrated circuit dies 50 previously described for FIG. 10. After the wafer 40 is bonded to the power distribution interposer 100, a singulation process is performed to singulate the wafer 40, in a similar manner as the singulation process previously described for FIG. 14, thereby forming a die structure 150 including a wafer portion 42, where the integrated circuit dies 50 are part of the wafer portion 42. After the singulation process, sidewalls of the wafer portion 42 and the power distribution interposer 100 are laterally coterminous, such that they have the same width.

Figure 16:
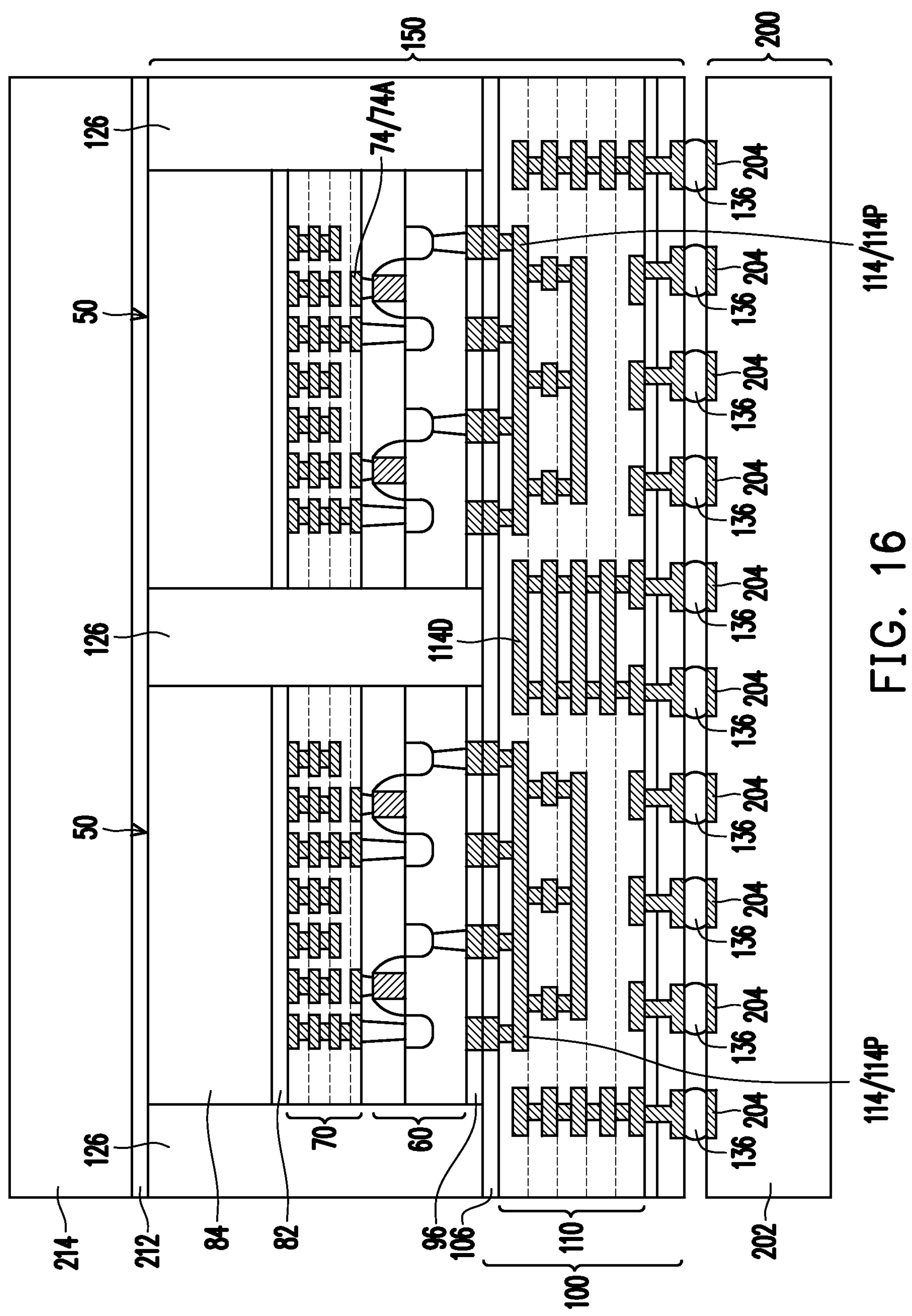
FIG. 16 is a cross-sectional view of an integrated circuit package, in accordance with some embodiments.

FIG. 16 is a cross-sectional view of an integrated circuit package, in accordance with some embodiments. This embodiment is similar to the embodiment of FIG. 14, except a support substrate 214 is bonded to top surface of the die structure 150 (e.g., the top surfaces of the support substrate 84 and the gap-filling dielectric 126). The support substrate 214 may be bonded to the die structure 150 by one or more bonding layer(s) 212. The support substrate 214 may be a glass support substrate, a ceramic support substrate, a semiconductor substrate (e.g., a silicon substrate), a wafer (e.g., a silicon wafer), or the like. The support substrate 214 may provide structural support during subsequent processing steps and in the completed device. The support substrate 214 be substantially free of any active or passive devices.

The support substrate 214 may be bonded to the die structure 150 using a suitable technique such as dielectric-to-dielectric bonding, or the like. Dielectric-to-dielectric bonding may include depositing the bonding layer(s) 212 on the die structure 150 and/or the support substrate 214. In some embodiments, the bonding layer(s) 212 are formed of silicon oxide (e.g., a high density plasma (HDP) oxide or the like) that is deposited by CVD, ALD, or the like. The bonding layer(s) 212 may likewise include oxide layers that are formed prior to bonding using, for example, CVD, ALD, thermal oxidation, or the like. Other suitable materials may be used for the bonding layer(s) 212.

The dielectric-to-dielectric bonding process may further include performing a surface treatment on one or more of the bonding layer(s) 212. The surface treatment may include a plasma treatment. The plasma treatment may be performed in a vacuum environment. After the plasma treatment, the surface treatment may further include performing a cleaning process (e.g., a rinse with deionized water or the like) on one or more of the bonding layer(s) 212. The support substrate 214 is then aligned with the die structure 150 and the two are pressed against each other to initiate a pre-bonding of the support substrate 214 to the die structure 150. The pre-bonding may be performed at about room temperature. After the pre-bonding, an annealing process may be performed. The bonds are strengthened by the annealing process.

The support substrate 214 is larger (e.g., wider) than the integrated circuit dies 50, e.g., than the support substrates 84. Utilizing a large support substrate may improve the structural support for the integrated circuit package. Additionally, a large support substrate may provide improved thermal dissipation for the integrated circuit package.

Figure 17:
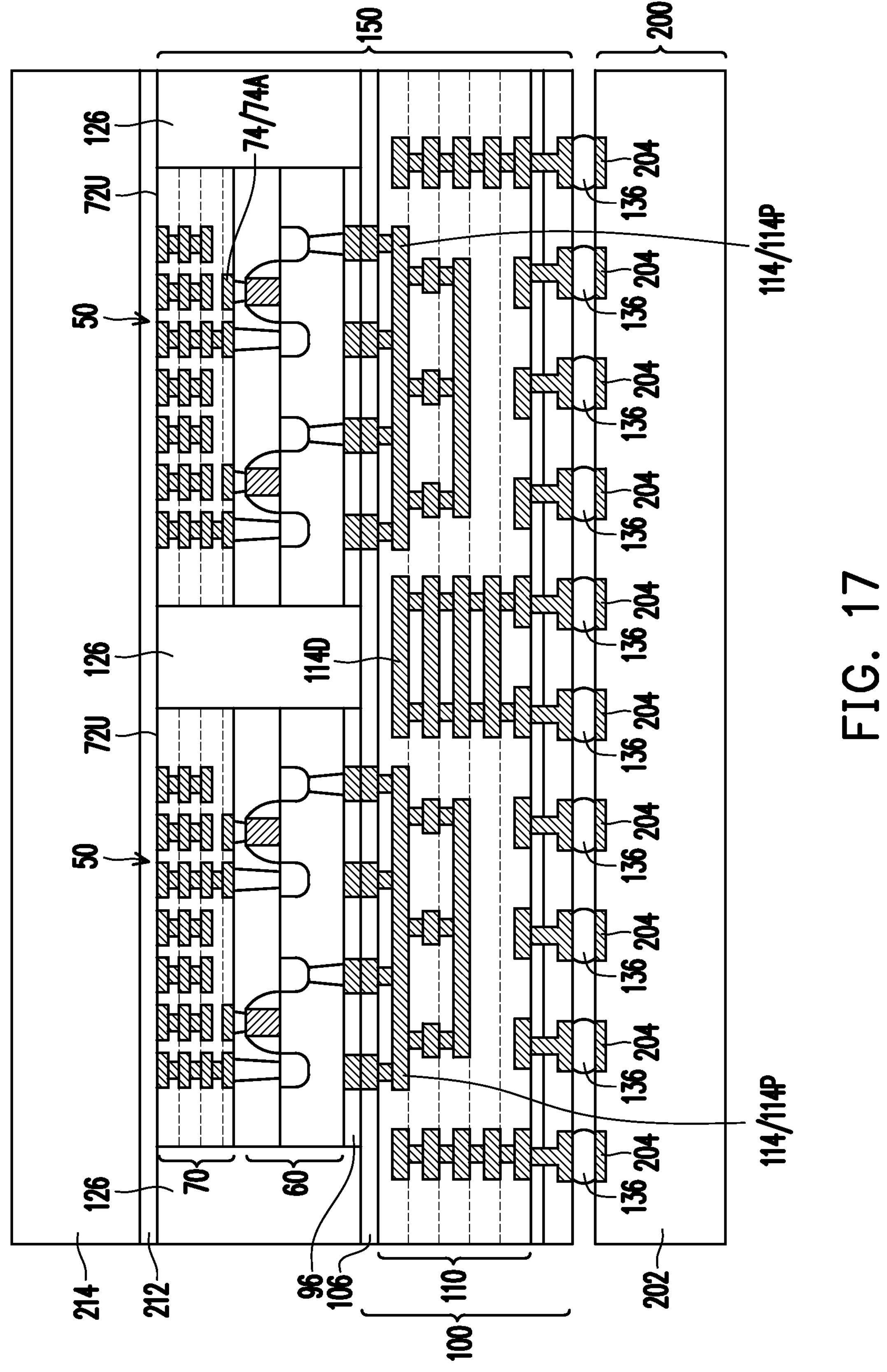
FIG. 17 is a cross-sectional view of an integrated circuit package, in accordance with some embodiments.

FIG. 17 is a cross-sectional view of an integrated circuit package, in accordance with some embodiments. This embodiment is similar to the embodiment of FIG. 16, except the bonding layer(s) 82 and/or the support substrates 84 are removed from the integrated circuit dies 50. As such, surfaces of the gap-filling dielectric 126 and the upper dielectric layer 72U of the front-side interconnect structure 70 are substantially coplanar (within process variations). The support substrate 214 is thus bonded to the top surfaces of the front-side interconnect structure 70 and to the gap-filling dielectric 126.

Embodiments may achieve advantages. Forming the power rails 114P and the data rails 114D in the back-side interconnect structure 110 of the power distribution interposer 100 (instead of in the integrated circuit dies 50) allows the interconnect density of the integrated circuit dies 50 to be increased, particularly when the back-side interconnect structure 110 is shared by multiple integrated circuit dies 50. The density of the integrated circuit packages may thus be increased.

In an embodiment, a device includes: a first integrated circuit die including a first device layer and a first front-side interconnect structure, the first front-side interconnect structure including first interconnects interconnecting first devices of the first device layer; a second integrated circuit die including a second device layer and a second front-side interconnect structure, the second front-side interconnect structure including second interconnects interconnecting second devices of the second device layer; and a power distribution interposer bonded to the first integrated circuit die and to the second integrated circuit die, the power distribution interposer including a back-side interconnect structure, the back-side interconnect structure including power rails connected to the first devices of the first device layer and to the second devices of the second device layer, a width of the power rails being greater than a width of the first interconnects and greater than a width of the second interconnects. In some embodiments of the device, the width of the power rails is at least twice the width of the first interconnects and at least twice the width of the second interconnects. In some embodiments of the device, the back-side interconnect structure further includes data rails connected to the first devices of the first device layer and to the second devices of the second device layer, a length of the data rails being greater than a length of the first interconnects and greater than a length of the second interconnects. In some embodiments of the device, the length of the power rails is at least twice the length of the first interconnects and at least twice the length of the second interconnects. In some embodiments of the device, the first integrated circuit die and the second integrated circuit die are free of power rails. In some embodiments of the device, the first device layer is disposed between the first front-side interconnect structure and the back-side interconnect structure, and the second device layer is disposed between the second front-side interconnect structure and the back-side interconnect structure. In some embodiments, the device further includes: a gap-filling dielectric around the first integrated circuit die and the second integrated circuit die, the gap-filling dielectric and the power distribution interposer being laterally coterminous. In some embodiments of the device, the first integrated circuit die and the second integrated circuit die are part of a wafer portion, the wafer portion and the power distribution interposer being laterally coterminous.

In an embodiment, a device includes: a power distribution interposer including: a first bonding layer; a first die connector in the first bonding layer; and a back-side interconnect structure including a power rail connected to the first die connector; and an integrated circuit die including: a second bonding layer directly bonded to the first bonding layer by dielectric-to-dielectric bonds; a second die connector in the second bonding layer, the second die connector directly bonded to the first die connector by metal-to-metal bonds; and a device layer on the second bonding layer, the device layer including a contact and a transistor, the transistor including a first source/drain region, the contact connecting a back-side of the first source/drain region to the second die connector. In some embodiments of the device, the transistor further includes a second source/drain region, and the integrated circuit die further includes a front-side interconnect structure, the front-side interconnect structure including an interconnect connected to a front-side of the second source/drain region. In some embodiments of the device, the integrated circuit die further includes a support substrate on the front-side interconnect structure, the support substrate and the front-side interconnect structure having the same width. In some embodiments, the device further includes: a support substrate on the integrated circuit die, the support substrate being wider than the front-side interconnect structure.

In an embodiment, a method includes: forming an integrated circuit die including a device layer, a first interconnect structure on a front-side of the device layer, and a first bonding layer on a back-side of the device layer; forming a power distribution interposer including a second bonding layer; and bonding the integrated circuit die to the power distribution interposer by: pressing the first bonding layer against the second bonding layer; and annealing the first bonding layer and the second bonding layer to form covalent bonds between a material of the first bonding layer and a material of the second bonding layer. In some embodiments of the method, the integrated circuit die further includes first die connectors in the first bonding layer, the power distribution interposer further includes second die connectors in the second bonding layer, and bonding the integrated circuit die to the power distribution interposer further includes annealing the first die connectors and the second die connectors to intermingle a material of the first die connectors and a material of the second die connectors. In some embodiments of the method, the device layer includes a transistor, the transistor includes a source/drain region, and forming the integrated circuit die includes forming a contact in the device layer, the contact connected to a back-side of the source/drain region. In some embodiments of the method, forming the integrated circuit die includes singulating the integrated circuit die before bonding the integrated circuit die to the power distribution interposer. In some embodiments of the method, bonding the integrated circuit die to the power distribution interposer includes bonding a wafer including the integrated circuit die to the power distribution interposer. In some embodiments, the method further includes: bonding a support substrate to the integrated circuit die. In some embodiments of the method, the power distribution interposer includes a second interconnect structure, the second bonding layer disposed on a first side of the second interconnect structure, the method further including: after bonding the integrated circuit die to the power distribution interposer, depositing a dielectric layer on a second side of the second interconnect structure; and forming external connectors in the dielectric layer. In some embodiments, the method further includes: connecting a package substrate to the external connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming an integrated circuit die comprising a device layer, a first interconnect structure on a front-side of the device layer, and a first bonding layer on a back-side of the device layer;

forming a power distribution interposer comprising a second bonding layer; and bonding the integrated circuit die to the power distribution interposer by:

pressing the first bonding layer against the second bonding layer; and annealing the first bonding layer and the second bonding layer to form covalent bonds between a material of the first bonding layer and a material of the second bonding layer; and forming a gap-filling dielectric around the integrated circuit die, a top surface of the gap-filling dielectric being coplanar with a top surface of the first interconnect structure.

2. The method of claim 1, wherein the integrated circuit die further comprises first die connectors in the first bonding layer, the power distribution interposer further comprises second die connectors in the second bonding layer, and bonding the integrated circuit die to the power distribution interposer further comprises annealing the first die connectors and the second die connectors to intermingle a material of the first die connectors and a material of the second die connectors.

3. The method of claim 1, wherein the device layer comprises a transistor, the transistor comprises a source/drain region, and forming the integrated circuit die comprises forming a contact in the device layer, the contact connected to a back-side of the source/drain region.

4. The method of claim 1, wherein forming the integrated circuit die comprises singulating the integrated circuit die before bonding the integrated circuit die to the power distribution interposer.

5. The method of claim 1, further comprising:

bonding a support substrate to the integrated circuit die.

6. The method of claim 1, wherein the power distribution interposer comprises a second interconnect structure, the second bonding layer disposed on a first side of the second interconnect structure, the method further comprising:

after bonding the integrated circuit die to the power distribution interposer, depositing a dielectric layer on a second side of the second interconnect structure; and forming external connectors in the dielectric layer.

7. The method of claim 6, further comprising:

connecting a package substrate to the external connectors.

8. The method of claim 1, wherein the device layer comprises a gate structure in an inter-layer dielectric and source/drain regions in a semiconductor substrate, the first interconnect structure disposed adjacent to the inter-layer dielectric, the first bonding layer disposed adjacent to the semiconductor substrate.

9. A method comprising:

forming a power distribution interposer comprising:

a first bonding layer;

a first die connector in the first bonding layer; and a back-side interconnect structure comprising a power rail connected to the first die connector; and forming an integrated circuit die comprising:

a second bonding layer;

a second die connector in the second bonding layer;

a device layer on the second bonding layer, the device layer comprising a contact and a transistor, the transistor comprising a first source/drain region and a second source/drain region, the contact connecting a back-side of the first source/drain region to the second die connector; and a front-side interconnect structure on the device layer, the front-side interconnect structure comprising an interconnect that is connected to a front-side of the second source/drain region, a width of the power rail being greater than a width of the interconnect;

bonding the integrated circuit die to the power distribution interposer, the second bonding layer directly bonded to the first bonding layer by dielectric-to-dielectric bonds, the second die connector directly bonded to the first die connector by metal-to-metal bonds;

after bonding the integrated circuit die to the power distribution interposer, forming a gap-filling dielectric around the integrated circuit die, a top surface of the gap-filling dielectric being coplanar with a top surface of the integrated circuit die; and singulating the gap-filling dielectric and the power distribution interposer.

10. The method of claim 9, wherein the integrated circuit die further comprises a support substrate on the front-side interconnect structure, the support substrate and the front-side interconnect structure having the same width.

11. The method of claim 9, further comprising:

bonding a support substrate to the front-side interconnect structure of the integrated circuit die, the support substrate being wider than the front-side interconnect structure.

12. The method of claim 9, further comprising:

after singulating the gap-filling dielectric and the power distribution interposer, connecting a package substrate to the power distribution interposer.

13. The method of claim 9, wherein the back-side interconnect structure further comprises a stack of dielectric layers, and the power rail is among the stack of dielectric layers.

14. A method comprising:

forming a die structure by:

forming a power distribution interposer comprising a back-side interconnect structure, the back-side interconnect structure comprising power rails and data rails;

attaching a plurality of integrated circuit dies to the power distribution interposer, each of the integrated circuit dies comprising a device layer and a front-side interconnect structure, the device layer disposed between the front-side interconnect structure and the power distribution interposer, the power rails being connected to transistors in the device layer of each of the integrated circuit dies, and the data rails interconnecting the transistors of one of the integrated circuit dies with the transistors of another of the integrated circuit dies;

forming a gap-filling dielectric between the integrated circuit dies, wherein a top surface of the gap-filling dielectric is coplanar with a top surface of the front-side interconnect structure of the integrated circuit dies; and singulating the gap-filling dielectric and the power distribution interposer; and connecting the power distribution interposer of the die structure to a package substrate.

15. The method of claim 14, wherein the front-side interconnect structure of each of the integrated circuit dies comprises interconnects, and a width of the power rails is greater than a width of the interconnects.

16. The method of claim 14, wherein the front-side interconnect structure of each of the integrated circuit dies comprises interconnects, and a length of the data rails is greater than a length of the interconnects.

17. The method of claim 14, further comprising:

bonding a support substrate to the die structure, the support substrate being wider than the integrated circuit dies.

* * * * *